(12) United States Patent
Song

(10) Patent No.: US 12,193,302 B2
(45) Date of Patent: Jan. 7, 2025

(54) DISPLAY DEVICE

(71) Applicant: Samsung Display Co., LTD., Yongin-si (KR)

(72) Inventor: Jung Bae Song, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 251 days.

(21) Appl. No.: 16/933,919

(22) Filed: Jul. 20, 2020

(65) Prior Publication Data

US 2021/0050388 A1 Feb. 18, 2021

(30) Foreign Application Priority Data

Aug. 16, 2019 (KR) .................... 10-2019-0100251

(51) Int. Cl.
*H10K 59/35* (2023.01)
*H10K 50/86* (2023.01)
*H10K 59/38* (2023.01)

(52) U.S. Cl.
CPC ......... *H10K 59/353* (2023.02); *H10K 50/865* (2023.02); *H10K 59/352* (2023.02); *H10K 59/38* (2023.02)

(58) Field of Classification Search
CPC ............. H01L 27/3218; H01L 27/3216; H01L 27/322; H01L 51/5284; H10K 59/353; H10K 59/352; H10K 59/38; H10K 59/8792; H10K 59/12–1315; H10K 50/865

See application file for complete search history.

(56) References Cited

U.S. PATENT DOCUMENTS

| 9,343,516 | B2 | 5/2016 | Motoyama et al. |
| 9,711,584 | B2 | 7/2017 | Motoyama et al. |
| 10,026,783 | B2 | 7/2018 | Kim |
| 10,103,205 | B2 | 10/2018 | Gu et al. |
| 10,325,973 | B2 | 6/2019 | Motoyama et al. |
| 10,658,447 | B2 | 5/2020 | Motoyama et al. |
| 10,705,271 | B2 | 7/2020 | Kim et al. |

(Continued)

FOREIGN PATENT DOCUMENTS

| CN | 107871775 A | * | 4/2018 | ......... H01L 27/3218 |
| JP | 2016-537688 | | 12/2016 | |

(Continued)

OTHER PUBLICATIONS

Machine translation of CN107871775, translated Jul. 7, 2023 (Year: 2023).*

*Primary Examiner* — Lauren R Bell
(74) *Attorney, Agent, or Firm* — KILE PARK REED & HOUTTEMAN PLLC

(57) ABSTRACT

According to one aspect of the invention, a display device includes a pixel including a first subpixel to display a first color, a second subpixel to display a second color, and a third subpixel to display a third color, wherein the pixel includes a first light outputting region overlapping the first subpixel, a second light outputting region overlapping the second subpixel, a third light outputting region overlapping the third subpixel, and a light blocking region disposed around each of the light outputting regions, the first light outputting region has a generally square shape, and the second light outputting region and the third light outputting region each have a generally rectangular shape.

17 Claims, 16 Drawing Sheets

(56) References Cited

U.S. PATENT DOCUMENTS

| | | | |
|---|---|---|---|
| 10,712,606 B2 | 7/2020 | Kim et al. | |
| 10,840,307 B2 | 11/2020 | Gu et al. | |
| 11,056,554 B2 | 7/2021 | Motoyama et al. | |
| 2013/0342795 A1* | 12/2013 | Park | G02F 1/13394 |
| | | | 349/110 |
| 2014/0117339 A1* | 5/2014 | Seo | H01L 51/5012 |
| | | | 257/89 |
| 2015/0155346 A1* | 6/2015 | Motoyama | H01L 27/3272 |
| | | | 257/89 |
| 2016/0240593 A1* | 8/2016 | Gu | H01L 27/3262 |
| 2017/0256591 A1 | 9/2017 | Li | |
| 2019/0179065 A1* | 6/2019 | Kim | H01L 27/322 |

FOREIGN PATENT DOCUMENTS

| | | |
|---|---|---|
| KR | 10-2015-0063313 | 6/2015 |
| KR | 10-2016-0123451 | 10/2016 |
| KR | 10-2018-0076422 | 7/2018 |
| KR | 10-2018-0130015 | 12/2018 |
| KR | 10-2019-0067955 | 6/2019 |

\* cited by examiner

DISPLAY DEVICE

CROSS REFERENCE TO RELATED APPLICATION

This application claims priority from and the benefit of Korean Patent Application No. 10-2019-0100251 filed on Aug. 16, 2019, which is hereby incorporated by reference for all purposes as if fully set forth herein.

BACKGROUND

Field

Exemplary implementations of the invention relate generally to a display device, and, more specifically, to an organic light-emitting display device including a wavelength conversion layer.

Discussion of the Background

The importance of display devices is increasing along with the development of multimedia. Accordingly, various kinds of display devices such as liquid crystal display (LCD) devices and organic light-emitting diode (OLED) display devices are being developed.

Among display devices, a self-light-emitting display device includes a self-light-emitting element, for example, an organic light-emitting element. The self-light-emitting element may include two opposite electrodes and a light-emitting layer interposed therebetween. When the self-light-emitting element is the organic light-emitting element, electrons and holes provided from the two electrodes may recombine in the light-emitting layer to generate excitons, and the generated excitons may transition from an excited state to a ground state to emit light.

Since the self-light-emitting display device does not require a separate light source, the self-light-emitting display device has low power consumption, is thin and lightweight, and has high quality characteristics such as a wide viewing angle, high luminance and contrast, and a fast response speed. Accordingly, the self-light-emitting display device is receiving attention as a next generation display device.

The above information disclosed in this Background section is only for understanding of the background of the inventive concepts, and, therefore, it may contain information that does not constitute prior art.

SUMMARY

Applicant realized that when resolution of a display device is increased, the size of a pixel is correspondingly decreased, which could result in unwanted color mixing. However, there is a limit in decreasing a minimum width of a light blocking region for preventing color mixing. In a high resolution display device, when an aperture ratio is decreased, not only luminance efficiency may be decreased but also color reproducibility may be affected.

Display devices constructed according to the principles and exemplary implementations of the invention have high color reproducibility while also having a high aperture ratio.

Additional features of the inventive concepts will be set forth in the description which follows, and in part will be apparent from the description, or may be learned by practice of the inventive concepts.

According to one aspect of the invention, a display device includes a pixel including a first subpixel to display a first color, a second subpixel to display a second color, and a third subpixel to display a third color, wherein the pixel includes a first light outputting region overlapping the first subpixel, a second light outputting region overlapping the second subpixel, a third light outputting region overlapping the third subpixel, and a light blocking region disposed around each of the light outputting regions, the first light outputting region has a generally square shape, and the second light outputting region and the third light outputting region have a generally rectangular shape.

One of the second light outputting region and the third light outputting region may have a generally rectangular shape in which a vertical side may be longer than a horizontal side, and the other thereof may have a generally rectangular shape in which a horizontal side is longer than a vertical side.

The first color may be a red color, the second color may be a green color, and the third color may be a blue color.

The first, second and third light outputting regions may have first, second and third areas, respectively, with the first area of the first light outputting region being greater than the second area of the second light outputting region, and the second area of the second light outputting region being greater than the third area of the third light outputting region.

The light blocking region may have a minimum width of at least about 24 μm.

A ratio of an area occupied by the first light outputting region, the second light outputting region, and the third light outputting region to an area of the pixel may be at least about 50%.

The pixel may have a generally square shape.

A horizontal side of the pixel may be generally parallel to a horizontal side of each of the first, second, and third light outputting regions, and a vertical side of the pixel may be generally parallel to a vertical side of each of the first, second, and third light outputting regions.

The pixel may further include a first emission region corresponding to the first subpixel and overlapping the first light outputting region, a second emission region corresponding to the second subpixel and overlapping the second light outputting region, and a third emission region corresponding to the third subpixel and overlapping the third light outputting region.

At least one side of the first emission region may be disposed inwardly from at least one side of the first light outputting region, at least one side of the second emission region may be disposed inwardly from at least one side of the second light outputting region, and at least one side of the third emission region may overlap at least one side of the third light outputting region.

According to a further aspect of the invention, a display device has a pixel including a first subpixel to display a first color, a second subpixel to display a second color, and a third subpixel to display a third color, a first display substrate including a first substrate, a subpixel electrode disposed on the first substrate and overlapping each of the first, second, and third subpixels, a pixel definition film disposed on the first substrate along boundaries between the first subpixel, the second subpixel, and the third subpixel and exposing the subpixel electrode, a first layer disposed on the subpixel electrode exposed by the pixel definition film, and a common electrode disposed on the first layer; and a second display substrate opposite to the first display substrate and including a second substrate, a second layer disposed on the second substrate and overlapping each of the first, second, and third subpixels, and a light blocking member disposed on the second substrate along the boundaries between the first subpixel, the second subpixel, and the third subpixel, wherein the light blocking member defines a light outputting region and a light blocking region of the second display substrate, the light outputting region includes a first light outputting region overlapping the first subpixel, a second light outputting region overlapping the second subpixel, and a third light outputting region overlapping the third subpixel, and the first light outputting region has a generally square shape.

One of the second light outputting region and the third light outputting region may have a generally rectangular shape in which a vertical side may be longer than a horizontal side, and the other thereof may have a generally rectangular shape in which a horizontal side may be longer than a vertical side.

The first color may be a red color, the second color may be a green color, and the third color may be a blue color.

The first layer may include a light-emitting layer and the second layer may include a color control layer, the color control layer having a first wavelength conversion pattern overlapping the first subpixel to convert light with the third color into light with the first color, a second wavelength conversion pattern overlapping the second subpixel to convert the light with the third color into light with the second color, and a light transmission layer overlapping the third subpixel to transmit the light with the third color.

An area of the first light outputting region may be greater than an area of the second light outputting region, and the area of the second light outputting region may be greater than an area of the third light outputting region.

The light blocking region may have a minimum width of at least about 24 μm, and a ratio of an area occupied by the first light outputting region, the second light outputting region, and the third light outputting region to an area of the pixel may be at least about 50%.

A red color filter layer may be disposed between the second substrate and the first wavelength conversion pattern, a green color filter layer may be disposed between the second substrate and the second wavelength conversion pattern, and a blue color filter layer may be disposed between the second substrate and the light transmission layer.

The pixel definition film may define an emission region and a non-emission region of the first display substrate, and the emission region may include a first emission region overlapping the first subpixel and the first light outputting region, a second emission region overlapping the second subpixel and the second light outputting region, and a third emission region overlapping the third subpixel and the third light outputting region.

At least one side of the first emission region may be disposed inwardly from at least one side of the first light outputting region, at least one side of the second emission region may be disposed inwardly from at least one side of the second light outputting region, and at least one side of the third emission region may overlap at least one side of the third light outputting region.

A filling layer may be disposed between the first display substrate and the second display substrate, filling layer coupling the first display substrate and the second display substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
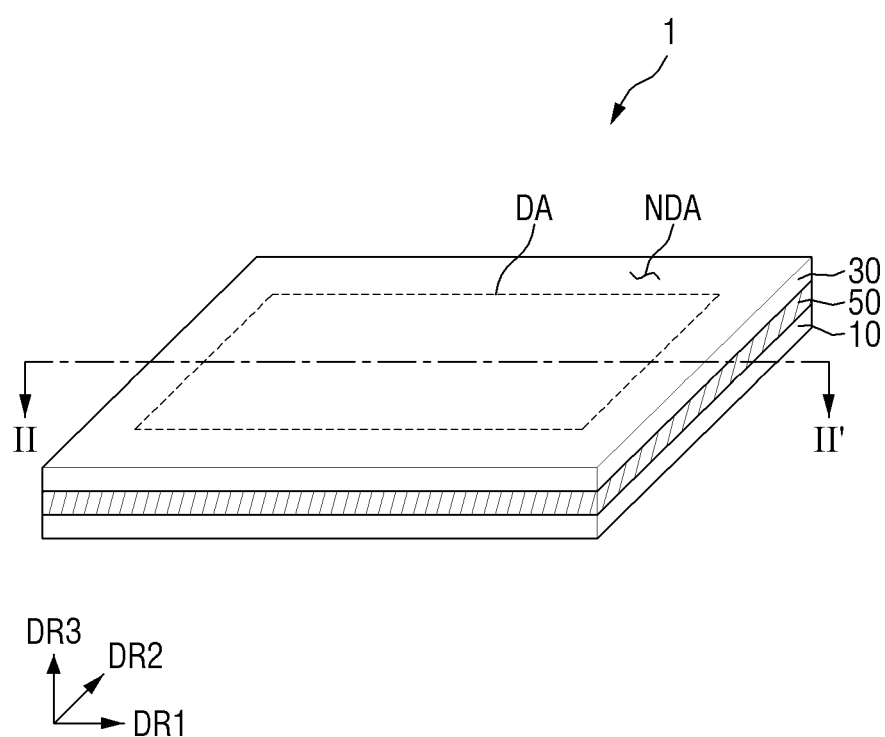
FIG. 1 is a perspective view illustrating an exemplary embodiment of a display device constructed according to principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view illustrating an exemplary embodiment of a display device constructed according to principles of the invention.

Referring to FIG. 1, a display device 1 may refer to all electronic devices which are provided with a display screen. For example, the display device 1 may include a television, a laptop computer, a monitor, a billboard, a mobile phone, a smartphone, a tablet personal computer (PC), an electronic watch, a smart watch, a watch phone, a mobile communication terminal, an electronic notebook, an electronic book, a portable multimedia player (PMP), a navigation device, a game machine, a digital camera, and a device for Internet of Things, which are provided with a display screen.

The display device 1 illustrated in the drawing is a television. The exemplary embodiments are not limited thereto, but the display device 1 may have a high resolution or an ultra high resolution such as HD, UHD, 4 K, or 8 K.

The display device 1 may have a generally rectangular shape in a plan view. The shape of the display device 1 is not limited to the illustrated planar shape, as a generally circular shape or other shapes may be used as well.

The display device 1 may include a display region DA in which an image is displayed and a non-display region NDA in which an image is not displayed. The display region DA may include a plurality of pixels PX, as depicted hereinafter. The non-display region NDA may be disposed around the display region DA and may surround the display region DA.

Figure 2:
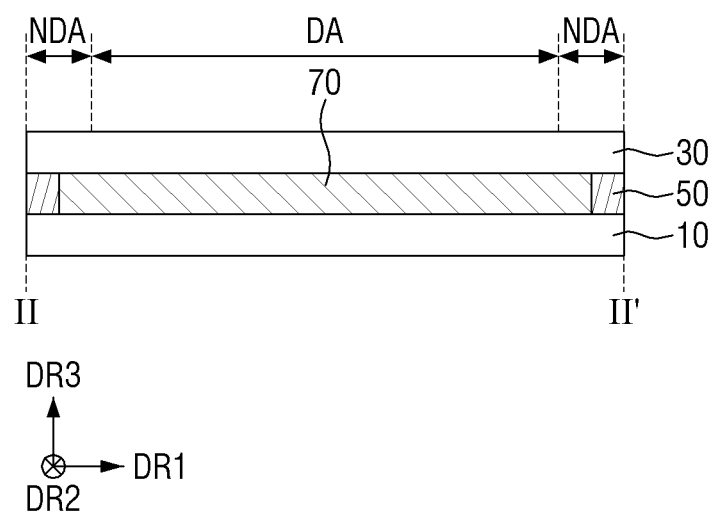
FIG. 2 is a schematic cross-sectional view taken along line II-II' of FIG. 1.

FIG. 2 is a schematic cross-sectional view taken along line II-IF of FIG. 1.

Referring to FIG. 2, the display device 1 may include a first display substrate 10 and a second display substrate 20 opposite to the first display substrate 10. The display device 1 may further include a sealing member 50 which couples the first display substrate 10 and the second display substrate 20 and a filling layer 70 which is filled in between the first display substrate 10 and the second display substrate 20.

The first display substrate 10 may include elements and circuits for displaying an image. For example, the first display substrate 10 may include a pixel circuit such as a switching element, a pixel definition film PDL configured to define an emission region EMA and a non-emission region NEM to be described below in the display region DA, and a self-light-emitting element. In an exemplary embodiment, the self-light-emitting element may include at least one of an organic light-emitting diode (LED), a quantum dot LED, or an inorganic material-based micro LED (for example, a micro LED), and an inorganic material-based nano LED (for example, a nano LED). Hereinafter, a case in which the self-light-emitting element is the organic LED will be described as an example.

The second display substrate 20 may be disposed above the first display substrate 10 and may be opposite to the first display substrate 10. The second display substrate 20 may include a color control structure which converts the color of incident light.

The sealing member 50 may be positioned between the first display substrate 10 and the second display substrate 20 in the non-display region NDA. The sealing member 50 may be disposed along edges of the first display substrate 10 and the second display substrate 20 in the non-display region NDA and may surround the display region DA in a plan view. The first display substrate 10 and the second display substrate 20 may be coupled to each other via the sealing member 50. The sealing member 50 may include an organic material. The sealing member 50 may be made of an epoxy resin, but the exemplary embodiments are not limited thereto.

The filling layer 70 may be disposed in a space between the first display substrate 10 and the second display substrate 20, which is surrounded by the sealing member 50. The filling layer 70 may fill the space between the first display substrate 10 and the second display substrate 20. The filling layer 70 may be made of a material capable of transmitting light. The filling layer 70 may include an organic material. For example, the filling layer 70 may be made of a silicon (Si)-based organic material, an epoxy-based organic material, or the like, but the exemplary embodiments are not limited thereto. The filling layer 70 may be omitted.

Figure 3:
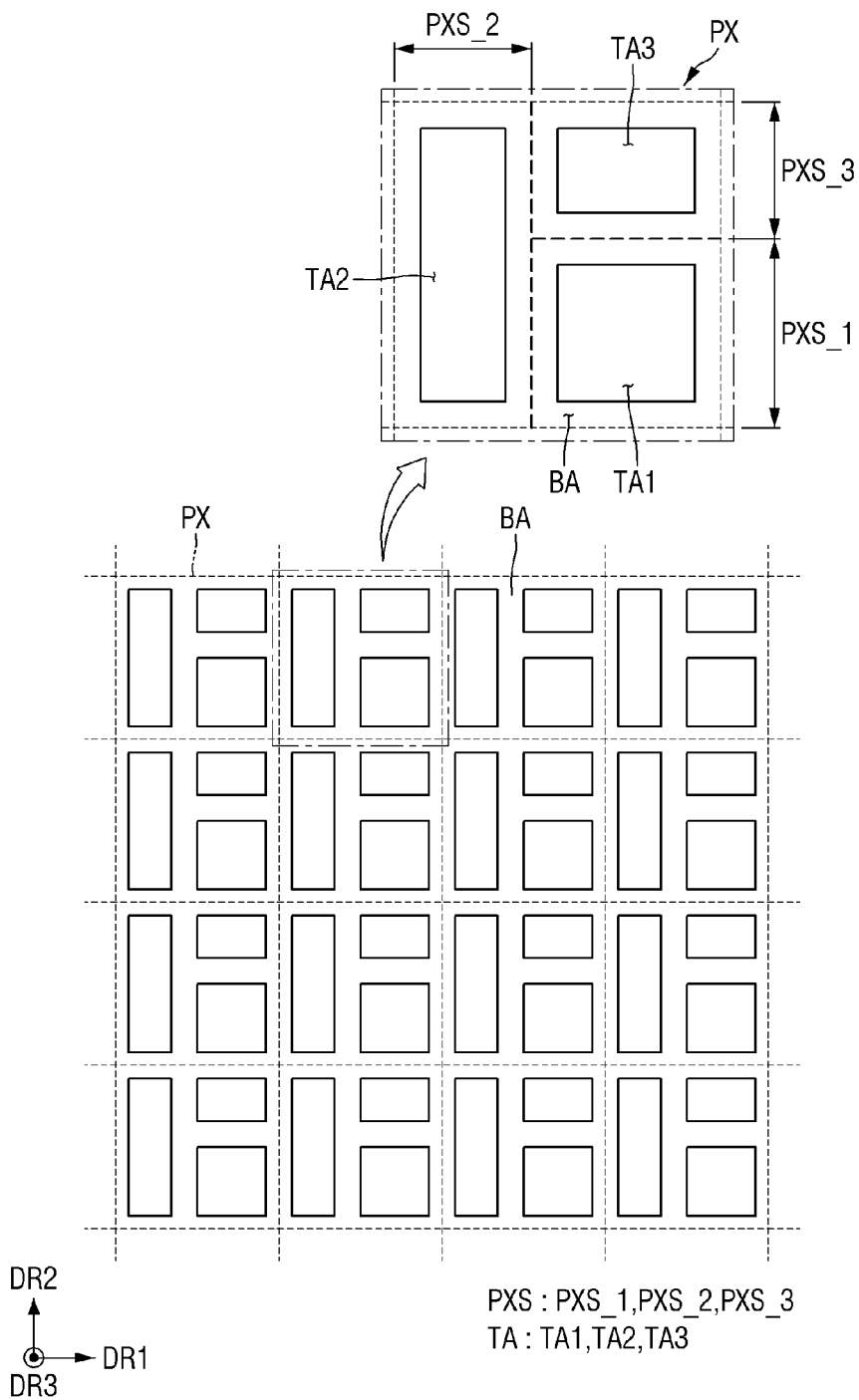
FIG. 3 is a top, plan view illustrating an exemplary embodiment of a pixel arrangement of the display device of FIG. 1, including an enlarged region thereof.

FIG. 3 is a top, plan view illustrating an exemplary embodiment of a pixel arrangement of the display device of FIG. 1, including an enlarged region thereof. Hereinafter, a first direction DR1 of FIG. 3 may refer to a horizontal direction, and a second direction DR2 may refer to a vertical direction.

Referring to FIG. 3, the display region DA of the display device includes a plurality of pixels PX. The representative pixel PX means a repeated minimum unit for displaying images. In order to display full color, each pixel PX may include a plurality of subpixels PXS (PXS_1, PXS_2, and PXS_3) which emit different colors. For example, each pixel PX may include a first subpixel PXS_1 which serves to emit red light, a second subpixel PXS_2 which serves to emit green light, and a third subpixel PXS_3 which serves to emit blue light. One first subpixel PXS_1, one second subpixel PXS_2, and one third subpixel PXS_3 may be provided for each pixel PX.

Each subpixel PXS may include a light outputting region TA and a light blocking region BA around the light outputting region TA. The light blocking region BA of one subpixel PXS is in contact with the light blocking region BA of an adjacent subpixel PXS (regardless of whether the one subpixel PXS and the adjacent subpixel PXS are subpixels included in the same pixel PX). The light blocking regions BA of adjacent subpixels PXS may be connected as one integral member. Furthermore, the light blocking regions BA of all subpixels PXS may be connected as one integral member, but the exemplary embodiments are not limited thereto. The light outputting regions TA of adjacent subpixels PXS may be divided by the light blocking regions BA. The light outputting region TA and the light blocking region BA will be described again in detail below.

Conceptually, adjacent subpixels PXS may be interpreted as being in contact with each other. Even in such a case, a boundary between the subpixels PXS may be placed in the light blocking regions BA which are integrally connected and thus may not be physically identified. The boundary between the subpixels PXS may be placed at a middle point of a separation space between the light outputting regions TA of adjacent subpixels PXS (or, a middle point of the light blocking region BA in a width direction thereof). The overall shape of the subpixel PXS may be similar to the shape of the light outputting region TA of the subpixel PXS but is not limited thereto.

The light outputting regions TA (TA1, TA2, and TA3) of the subpixel PXS in each pixel PX may have different shapes. For example, the light outputting region TA of the first subpixel PXS_1 (hereinafter, referred to as a first light outputting region TA1) may have a generally square shape. The light outputting region TA of the second subpixel PXS_2 (hereinafter, referred to as a second light outputting region TA2) may have a generally rectangular shape in which a vertical side is longer than a horizontal side. The light outputting region TA of the third subpixel PXS_3 (hereinafter, a third light outputting region TA3) may have a generally rectangular shape in which a horizontal side is longer than a vertical side. As used herein, the term "rectangular shape" or "generally rectangular shape" may include not only a shape that is a pure rectangular shape in which opposite sides are composed of parallel line segments, but also a shape that may be considered as an approximately rectangular shape. For example, even in a case in which a curve or unevenness is present in at least a section of each side, when line segments connected in an extending direction constitute a generally rectangular shape, the generally rectangular shape may be interpreted as being included in the rectangular shape. In addition, even in a case in which extending directions of opposite sides are not completely parallel, when a crossing angle between the extending directions is less than or equal to about 15° or about 5° and thus the extending directions are approximately parallel to each other when viewed with a naked eye, the opposite sides may be interpreted as constituting a generally rectangular shape. In addition, as used herein, the term "square shape"

or "generally square shape" may include a shape that is a generally rectangular shape and also has four sides with the same length. In addition, a shape, in which although a certain degree of deviation is present between lengths of four sides thereof, the lengths are substantially similar when viewed with a naked eye, may also be considered as being a generally square shape. For example, when a deviation between a length of a horizontal side and a length of a vertical side of a generally rectangular shape is within about 10%, about 5%, or about 1%, the generally rectangular shape may be referred to as a generally square shape.

The shape and arrangement of each light outputting region TA in the pixel PX will be described in detail below.

The size of the pixel PX may be changed according to a size (area) and resolution of the display device. A length of a horizontal side (side extending in the first direction DR1) and a vertical side (side extending in the second direction DR2) of one pixel PX may be selected from a range of about 50 μm to about 10,000 μm or a range of about 150 μm to about 250 μm. In the case of a 65-inch display device having a resolution of about 8 K, a length of a horizontal side and a vertical side of one pixel PX may be in a range of about 180 μm to about 190 μm or about 186 μm but is not limited thereto.

Pixels PX each including the plurality of subpixels PXS may be alternately arranged in a matrix direction. The subpixels PXS in each pixel PX may have substantially the same shape and arrangement, but the exemplary embodiments are not limited thereto. The overall shape of each pixel PX including the plurality of subpixels PXS may be a generally square shape. However, the exemplary embodiments are not limited thereto, and the shape of each pixel PX may be modified into various shapes such as a generally rhombical shape and a generally rectangular shape.

Figure 4:
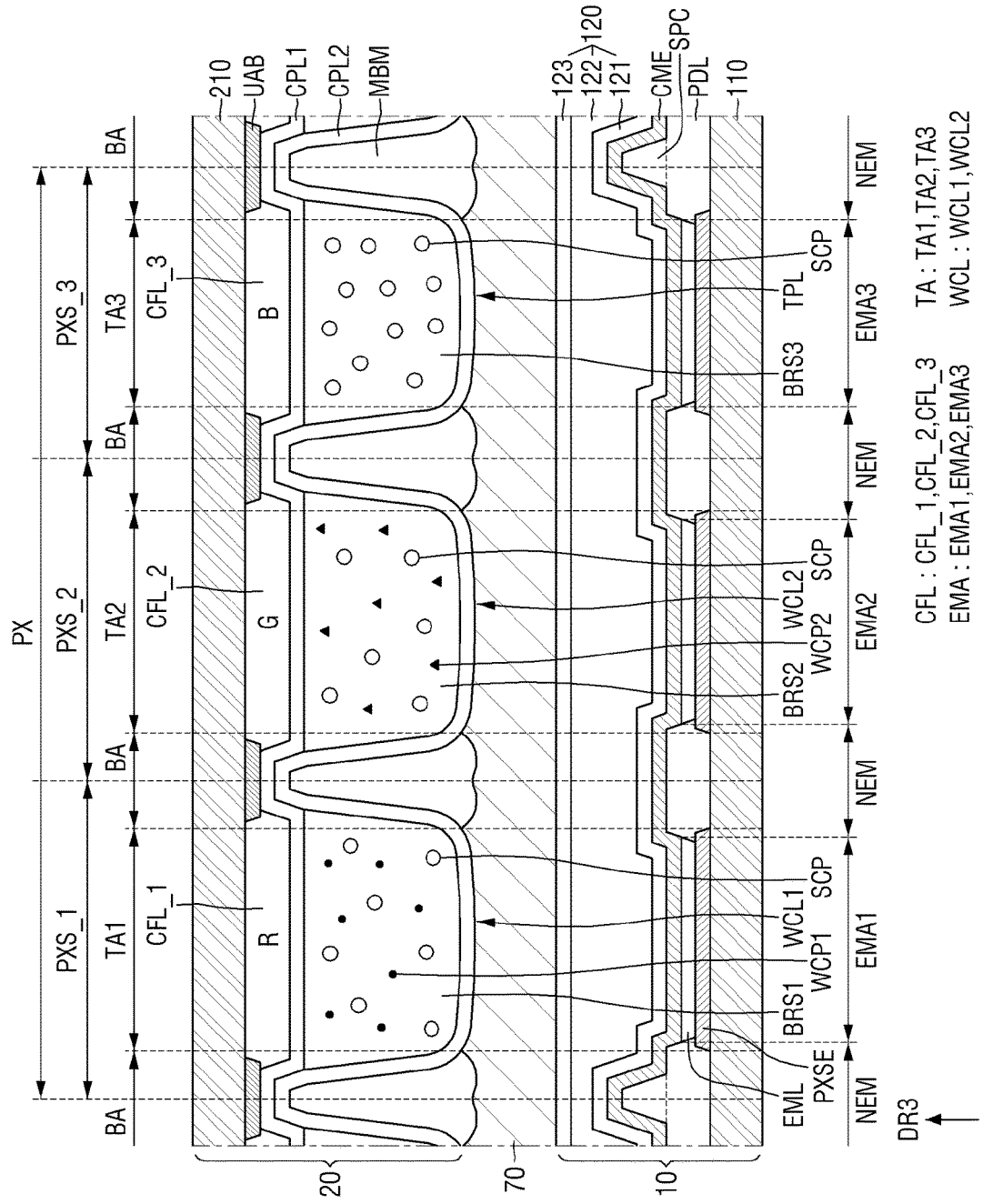
FIG. 4 is a cross-sectional view illustrating the display device of FIG. 3.

FIG. 4 is a cross-sectional view illustrating the display device of FIG. 3.

Referring to FIG. 4, the first display substrate 10 includes a first substrate 110 and a plurality of light-emitting elements disposed on the first substrate 110.

When a cross-sectional structure of the first display substrate 10 is described in an upward order in the drawing, the first substrate 110 may be an insulating substrate. The first substrate 110 may include a transparent material. For example, the first substrate 110 may include a transparent insulating material such as glass or quartz. The first substrate 110 may be a rigid substrate. However, the first substrate 110 is not limited to those illustrated above and may include a plastic such as a polyimide. The first substrate 110 may have flexible characteristics such as bendable, foldable, and rollable characteristics.

A plurality of subpixel electrodes PXSE may be disposed on one surface of the first substrate 110. One subpixel electrode PXSE may be provided for each subpixel PXS. The subpixel electrodes PXSE of adjacent subpixels PXS may be separated from each other. A circuit layer configured to drive each subpixel electrode PXSE may be disposed between the first substrate 110 and the subpixel electrode PXSE. The circuit layer may include a plurality of thin film transistors, a capacitor, and the like.

The subpixel electrode PXSE may be a first electrode of the light-emitting element (or an LED), for example, an anode electrode. The subpixel electrode PXSE may have a stacked film structure formed by stacking a material layer having a high work function and a reflective material layer, wherein the material layer is made of at least one selected from among indium tin oxide (ITO), indium zinc oxide (IZO), zinc oxide (ZnO), and indium oxide ($In_2O_3$), and the reflective material layer is made of one selected from among silver (Ag), magnesium (Mg), aluminum (Al), platinum (Pt), lead (Pd), gold (Au), nickel (Ni), neodymium (Nd), iridium (Ir), chromium (Cr), lithium (Li), calcium (Ca), and mixtures thereof. The material layer having the high work function may be disposed on the reflective material layer and may be disposed near to a light-emitting layer EML. The subpixel electrode PXSE may have a multilayer structure of ITO/Mg, ITO/MgF, ITO/Ag, or ITO/Ag/ITO, but the exemplary embodiments are not limited thereto.

The pixel definition film PDL may be disposed along a boundary between the subpixels PXS on one surface of the first substrate 110. The pixel definition film PDL may be disposed on the subpixel electrode PXSE and may have an opening exposing the subpixel electrode PXSE. The non-emission region NEM and the emission region EMA may be divided by the pixel definition film PDL and the opening thereof. The pixel definition film PDL may include an organic insulating material such as a polyacrylate-based resin, an epoxy resin, a phenolic resin, a polyamide-based resin, a polyimide-based resin, an unsaturated polyester-based resin, a polyphenylene ether-based resin, a polyphenylene sulfide-based resin, or benzocyclobutene (BCB). The pixel definition film PDL may also include an inorganic material.

A spacer SPC may be disposed on a partial region of the pixel definition film PDL. The spacer SPC may be disposed directly on the pixel definition film PDL. The spacer SPC may overlap the pixel definition film PDL in the thickness (DR3) direction thereof. The spacer SPC may serve to maintain a distance to a structure disposed thereon. For example, when an organic layer is deposited using a fine metal mask, the spacer SPC may serve to prevent sagging of the fine metal mask. In some cases, the spacer SPC may serve to support the structure stacked thereon and may mitigate deformation of the display device caused by stress when the display device is pressed.

The spacer SPC may have a generally polygonal shape such as a generally circular shape, a generally octagonal shape, or a generally hexagonal shape in a plan view. A diameter (width) of the spacer SPC may be less than or equal to a width of the pixel definition film PDL. The spacer SPC may be disposed only on a partial region of the pixel definition film PDL and thus may cause a stepped portion together with a portion of the pixel definition film PDL on which the spacer SPC is not disposed.

The spacer SPC may be made of an organic insulating material like the pixel definition film PDL. The spacer SPC may be formed as a separate layer from the pixel definition film PDL but may be formed integrally with the pixel definition film PDL using the same material through one process. For example, the pixel definition film PDL and the spacer SPC having different heights may be formed through one process of applying a photosensitive organic material and then exposing and developing the photosensitive organic material using a slit mask or a halftone mask.

The light-emitting layer EML is disposed on the subpixel electrode PXSE exposed by the pixel definition film PDL. In the exemplary embodiment in which the display device is an organic light-emitting display device, the light-emitting layer EML may include an organic layer including an organic material. The organic light-emitting layer EML may include the organic layer and may further include a hole injection/transport layer and/or an electron injection/transport layer as an auxiliary layer that assists in emitting light if necessary. In another exemplary embodiment, when the display device is a micro LED display device, a nano LED display device, or the like, the light-emitting layer EML may include an inorganic material such as an inorganic semiconductor.

In some exemplary embodiments, the light-emitting layer EML may have a tandem structure including a plurality of organic light-emitting layers EML disposed to overlap each other in a thickness (DR3) direction thereof and a charge generation layer disposed therebetween. The organic light-emitting layers EML disposed to overlap each other may also emit light having substantially the same wavelength but may also emit light having different wavelengths. At least some layers of the light-emitting layers EML of each subpixel PXS may be separated from layers of adjacent subpixels PXS, which are the same as the at least some layers.

In an exemplary embodiment, the wavelength of light emitted from each light-emitting layer EML may be substantially the same for each subpixel PXS. For example, the light-emitting layer EML of each subpixel PXS may emit blue light or ultraviolet light, and the color control structure may include a wavelength conversion layer WCL, thereby displaying a different color for each subpixel PXS.

In another exemplary embodiment, the wavelength of light emitted by each light-emitting layer EML may be different for each color pixel PX. For example, the light-emitting layer EML of the first subpixel PXS_1 may emit a first color, the light-emitting layer EML of the second subpixel PXS_2 may emit a second color, and the light-emitting layer EML of the third subpixel PXS_3 may emit a third color.

A common electrode CME may be disposed on the light-emitting layer EML. The common electrode CME may be in contact with an upper surface of the pixel definition film PDL as well as the light-emitting layer EML.

The common electrode CME may be connected without distinction to each subpixel PXS. The common electrode CME may be a whole surface electrode disposed on a whole surface of the subpixel PXS without distinction of the particular subpixel PXS. The common electrode CME may be a second electrode of the LED, for example, a cathode electrode.

The common electrode CME may include a material layer having a low work function, which is made of one selected from among Li, Ca, LiF/Ca, LiF/Al, Al, Mg, Ag, Pt, Pd, Ni, Au, Nd, Ir, Cr, BaF, Ba, and compounds or mixtures thereof (for example, a mixture of Ag and Mg). The common electrode CME may further include a transparent metal oxide layer disposed on the material layer having the low work function.

The subpixel electrode PXSE, the light-emitting layer EML, and the common electrode CME may constitute a light-emitting element (for example, an organic light-emitting element). Light emitted from the light-emitting layer EML may be emitted upward through the common electrode CME.

Thin film encapsulation structure 120 (121, 122, and 123) may be disposed on the common electrode CME. The thin film encapsulation structure 120 may include at least one thin film encapsulation layer. For example, the thin film encapsulation layer may include a first inorganic layer 121, an organic layer 122, and a second inorganic layer 123. The first inorganic layer 121 and the second inorganic layer 123 may each include silicon nitride, silicon oxide, silicon oxynitride, or the like. The organic layer 122 may include an organic insulating material such as a polyacrylate-based resin, an epoxy resin, a phenolic resin, a polyamide-based resin, a polyimide-based resin, an unsaturated polyester-based resin, a polyphenylene ether-based resin, a polyphenylene sulfide-based resin, or BCB.

The second display substrate 20 may be disposed above the thin film encapsulation structure 120 so as to be opposite to the thin film encapsulation structure 120. When a cross-sectional structure of the second display substrate 20 is described in a downward order in the drawing, the second substrate 210 of the second display substrate 20 may include a transparent material. The second substrate 210 may include a transparent insulating material such as glass or quartz. The second substrate 210 may be a rigid substrate. However, the second substrate 210 is not limited to those illustrated above and may include a plastic such as a polyimide. The second substrate 210 may have flexible characteristics such as bendable, foldable, and rollable characteristics.

The second substrate 210 may be the same substrate as the first substrate 110, but the material, thickness, transmittance thereof may be different from those of the first substrate 110. For example, the second substrate 210 may have transmittance higher than that of the first substrate 110. The second substrate 210 may be thicker or thinner than the first substrate 110.

An upper light absorbing member UAB may be disposed on one surface of the second substrate 210 facing the first substrate 110 along a boundary between the subpixels PXS. The upper light absorbing member UAB may overlap the pixel definition film PDL of the first display substrate 10 and may be positioned in the non-emission region NEM. The upper light absorbing member UAB may include an opening exposing one surface of the second substrate 210 which overlaps the emission region EMA. The upper light absorbing member UAB may not only serve to block light from being emitted from the display device but also serve to suppress external light from being reflected. The upper light absorbing member UAB may be formed in a grid shape in a plan view.

The upper light absorbing member UAB may be made of an organic material. In an exemplary embodiment, the upper light absorbing member UAB may include a light absorbing material that absorbs a visible light wavelength band. For example, the upper light absorbing member UAB may be made of a material used as a black matrix of the display device. The upper light absorbing member UAB may be a kind of light blocking member.

In another exemplary embodiment, the upper light absorbing member UAB may absorb light in a specific wavelength band of a visible light wavelength band and may transmit light in other specific wavelength bands. For example, the upper light absorbing member UAB may include the same material as that of one color filter layer CFL. Specifically, the upper light absorbing member UAB may be made of the same material as that of a third color filter layer (see "CFL_3") for a blue color. In some exemplary embodiments, the upper light absorbing member UAB may be formed integrally with the third color filter layer CFL_3. The upper light absorbing member UAB may be omitted.

The color filter layer CFL may be disposed on one surface of the second substrate 210 on which the upper light absorbing member UAB is disposed. The color filter layer CFL may serve to block emission of light with colors other than a corresponding color of each subpixel PXS. The color filter layer CFL may be disposed on one surface of the second substrate 210 exposed through the opening of the upper light absorbing member UAB. Furthermore, the color filter layer CFL may also be partially disposed on an adjacent upper light absorbing member UAB.

The color filter layer CFL may include a first color filter layer CFL_1 disposed in the first subpixel PXS_1, a second color filter layer CFL_2 disposed in the second subpixel PXS_2, and the third color filter layer CFL_3 disposed in the third subpixel PXS_3. Each color filter layer CFL may include a colorant such as a dye or a pigment that absorbs wavelengths other than a corresponding color wavelength. The first color filter layer CFL_1 may be a red R color filter layer, the second color filter layer CFL_2 may be a green G color filter layer, and the third color filter layer CFL_3 may be a blue B color filter layer. Adjacent color filter layers CFL are illustrated in the drawing as being spaced apart from each other on the upper light absorbing member UAB. However, the adjacent color filter layers CFL may also partially overlap each other on the upper light absorbing member UAB.

A first capping layer CPL1 may be disposed on the color filter layer CFL. The first capping layer CPL1 may prevent impurities such as external moisture or air from permeating into the color filter layer CFL to damage or contaminate the color filter layer CFL. In addition, the first capping layer CPL1 may prevent the colorant of the color filter layer CFL from being diffused into other components.

The first capping layer CPL1 may be in direct contact with one surface (lower surface of FIG. 2) of the color filter layer CFL. The first capping layer CPL1 may be made of an inorganic material. For example, the first capping layer CPL1 may be made of silicon nitride, aluminum nitride, zirconium nitride, titanium nitride, hafnium nitride, tantalum nitride, silicon oxide, aluminum oxide, titanium oxide, tin oxide, silicon oxynitride, or the like.

Color control layers WCL and TPL are disposed on the first capping layer CPL1. The color control layers may include a wavelength conversion layer WCL configured to convert a wavelength of incident light and/or a light transmission layer TPL configured to maintain and transmit a wavelength of incident light. The wavelength conversion layer WCL or the light transmission layer TPL may be disposed separately for each subpixel PXS. The wavelength conversion layer WCL or the light transmission layer TPL may overlap the emission region EMA and the light outputting region TA in a thickness direction thereof. Adjacent wavelength conversion layers WCL or adjacent wavelength conversion layer WCL and light transmission layer TPL may be spaced apart from each other. A separation space between the adjacent wavelength conversion layers WCL or the adjacent wavelength conversion layer WCL and light transmission layer TPL may approximately overlap the light blocking region BA. The separation space forms a valley having a grid shape in a plan view.

The wavelength conversion layer WCL may be disposed in a subpixel PXS in which, since a wavelength of light incident from the light-emitting layer EML is different from a wavelength of a color of the subpixel PXS, it is necessary to convert the wavelength. The light transmission layer TPL may be disposed in a subpixel PXS in which a wavelength of light incident from the light-emitting layer EML is the same as a wavelength of a color of the subpixel PXS. The illustrated exemplary embodiment relates to a case in which the light-emitting layer EML of each subpixel PXS emits light of a third color and corresponds to an example in which the wavelength conversion layers WCL are disposed in the first subpixel PXS_1 and the second subpixel PXS_2 and the light transmission layer TPL is disposed in the third subpixel PXS_3. In another example, when the light-emitting layer EML of each subpixel PXS emits light, such as ultraviolet light, having a wavelength different from a wavelength of a color of each subpixel PXS, only the wavelength conversion layer WCL may be provided without the light transmission layer TPL. In still another example, when the light-emitting layer EML of each subpixel PXS emits light corresponding to a color of each subpixel PXS, only the light transmission layer TPL may be provided without the wavelength conversion layer WCL, or the light transmission layer TPL may be omitted from all the subpixels PXS.

In the illustrated exemplary embodiment, the wavelength conversion layer WCL may include a first wavelength conversion pattern WCL1 disposed in the first subpixel PXS_1 and a second wavelength conversion pattern WCL2 disposed in the second subpixel PXS_2.

The first wavelength conversion pattern WCL1 may include a first base resin BRS1 and a first wavelength conversion material WCP1 disposed in the first base resin BRS1. The second wavelength conversion pattern WCL2 may include a second base resin BRS2 and a second wavelength conversion material WCP2 disposed in the second base resin BRS2. The light transmission layer TPL may include a third base resin BRS3 and scatterers SCP disposed in the third base resin BRS3.

The first to third base resins BRS1, BRS2, and BRS3 may include a transparent organic material. For example, the first to third base resins BRS1, BRS2, and BRS3 may be made of an epoxy-based resin, an acrylic-based resin, a cardo-based resin, an imide-based resin, or the like. All of the first to third base resins BRS1, BRS2, and BRS3 may be made of the same material, but the exemplary implementations are not limited thereto.

The scatterers SCP may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like.

The first wavelength conversion material WCP1 may be a material that converts blue light into red light, and the second wavelength conversion material WCP2 may be a material that converts blue light into green light. The first wavelength conversion material WCP1 and the second wavelength conversion material WCP2 may be quantum dots, quantum rods, fluorescent materials, or the like. The quantum dots may include IV group-based nanocrystals, II-VI group-based compound nanocrystals, III-V group-based compound nanocrystals, IV-VI group-based nanocrystals, or combinations thereof. The first wavelength conversion pattern WCL1 and the second wavelength conversion pattern WCL2 may further include the scatterers SCP for increasing wavelength conversion efficiency.

The light transmission layer TPL disposed in the third subpixel PXS_3 transmits blue light incident from the light-emitting layer EML while maintaining a wavelength of the blue light. The scatterers SCP of the light transmission layer TPL may serve to scatter light and adjust an emission angle of light emitted through the light transmission layer TPL. The light transmission layer TPL may not include a wavelength conversion material.

A second capping layer CPL2 is disposed on the wavelength conversion layer WCL and the light transmission layer TPL. The second capping layer CPL2 may be made of an inorganic material. The second capping layer CPL2 may be made of at least one material selected from the materials described as the materials of the first capping layer CPL1.

The second capping layer CPL2 and the first capping layer CPL1 may be made of the same material, but the exemplary implementations are not limited thereto.

The second capping layer CPL2 may cover each of the wavelength conversion patterns WCL1 and WCL2 and the light transmission layer TPL. The second capping layer CPL2 may cover not only one surface but also side surfaces of each of the wavelength conversion patterns WCL1 and WCL2 and the light transmission layer TPL. The second capping layer CPL2 may be in contact with the first capping layer CPL1 in a separation space between adjacent color control layers WCL and TPL. The second capping layer CPL2 may have a shape conformal to a surface stepped portion formed by the color control layers WCL and TPL. A valley of the separation space between the color control layers WCL and TPL may not be completely filled with the second capping layer CPL2 and may have a certain depth.

The second capping layer CPL2 is disposed on a color mixing prevention member MBM. The color mixing prevention member MBM is made of a material capable of blocking light transmission and serves to prevent light from intruding into adjacent subpixels PXS to cause color mixing. The color mixing prevention member MBM may be disposed along the boundary between the subpixels PXS. For example, the color mixing prevention member MBM may be disposed along the separation space between the color control layers WCL and TPL. The color mixing prevention member MBM may fill the valley formed in the separation space between the color control layers WCL and TPL. The exemplary implementations are not limited thereto, and one surface of the color mixing prevention member MBM may further protrude in a thickness direction thereof as compared with one surface of each of the color control layers WCL and TPL. The height (or thickness) by which the color mixing prevention member (MBM) protrudes from the surrounding wavelength conversion pattern WCL1 or WCL2 or the light transmission layer TPL may be in a range of about 1 μm to about 3 μm, a range of about 1.4 μm to about 1.8 μm, or about 1.6 μm, but the exemplary implementations are not limited thereto.

The color mixing prevention member MBM may include an organic material. The color mixing prevention member MBM may include a light absorbing material that absorbs a visible light wavelength band. In an exemplary embodiment, the color mixing prevention member MBM may include an organic light blocking material. The color mixing prevention member MBM is a kind of light blocking member. The color mixing prevention member MBM may be made of the same material as that of the above-described upper light absorbing member UAB, but the exemplary implementations are not limited thereto.

The color mixing prevention member MBM may define the light blocking region BA and the light outputting region TA. A region in which the color mixing prevention member MBM is disposed becomes the light blocking region BA. The color control layers WCL and TPL which are not covered or are exposed by the color mixing prevention member MBM may become the light outputting regions TA.

The filling layer 70 may be disposed between the first display substrate 10 and the second display substrate 20. The filling layer 70 may fill a space between the first display substrate 10 and the second display substrate 20 and may serve to couple the first display substrate 10 and the second display substrate 20 to each other. The filling layer 70 may be disposed between the thin film encapsulation structure 120 of the first display substrate 10 and the second capping layer CPL2 of the second display substrate 20. The filling layer 70 may be made of a silicon-based organic material, an epoxy-based organic material, or the like, but the exemplary implementations are not limited thereto.

Figure 5:
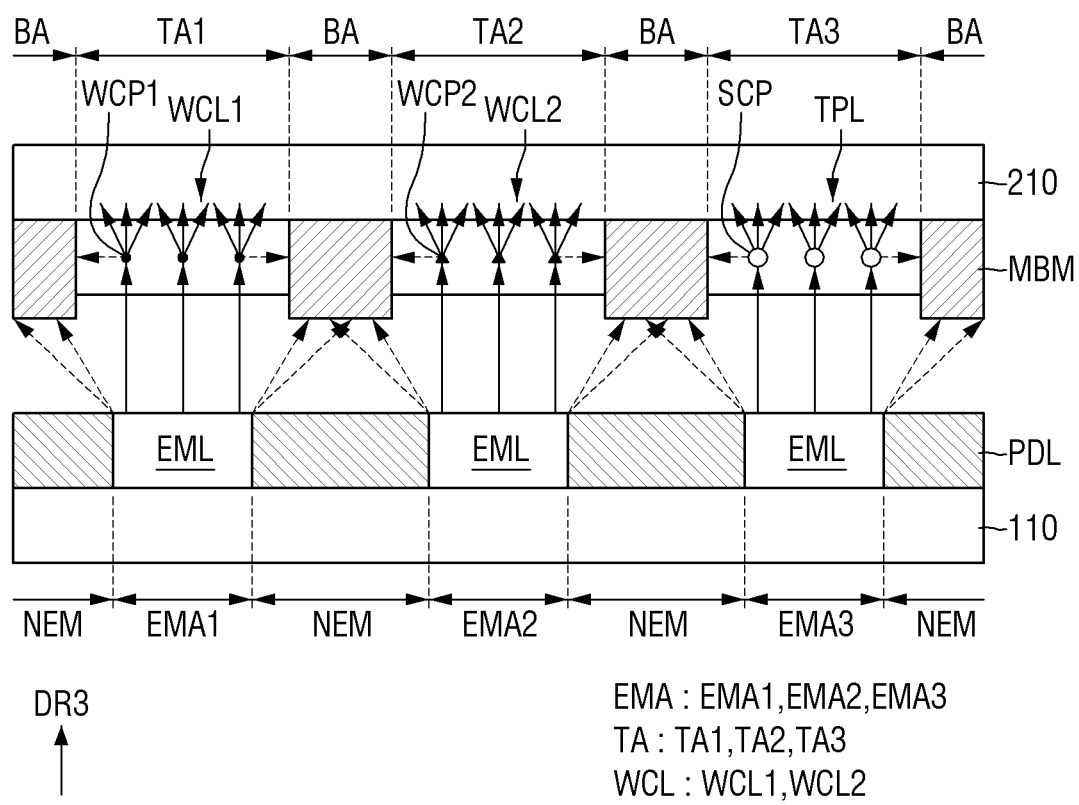
FIG. 5 is a schematic cross-sectional view illustrating a light traveling path of the display device of FIG. 4.

FIG. 5 is a schematic cross-sectional view illustrating a light traveling path of the display device of FIG. 4.

Referring to FIGS. 4 and 5, light emitted from the light-emitting layer EML of each subpixel PXS approximately travels toward the color control layer WCL or TPL disposed thereabove. Blue light emitted from the light-emitting layer EML of the first subpixel PXS_1 is converted into red light by the first wavelength conversion material WCP1 of the first wavelength conversion pattern WCL1 and is emitted upward. Blue light emitted from the light-emitting layer EML of the second subpixel PXS_2 is converted into green light by the second wavelength conversion material WCP2 of the second wavelength conversion pattern WCL2 and is emitted upward. Blue light emitted from the light-emitting layer EML of the third subpixel PXS_3 is emitted through the light transmission layer TPL without a change in wavelength thereof.

Light may be scattered while colliding with the wavelength conversion materials WCP1 and WCP2 and/or the scatterers SCP in the color control layers WCL and TPL. The scattered light may partially travel toward adjacent subpixels PXS but may be prevented from intruding into the adjacent subpixels PXS by the color mixing prevention member MBM disposed between the subpixels PXS.

Light emitted from the light-emitting layer EML of the emission region EMA may have a certain directional angle and thus may travel in a direction inclined outward as well as in a vertical direction. Since the light-emitting layer EML and the color control layers WCL and TPL are spaced apart from each other by a certain distance, in some cases, light emitted from the light-emitting layer EML of a specific subpixel PXS may travel toward the color control layers WCL and TPL of adjacent subpixels PXS. The color mixing prevention member MBM may perform a function of blocking light from traveling to the color control layers WCL and TPL of the adjacent subpixels PXS as described above. When the color mixing prevention member MBM further protrudes as compared with the color control layers WCL and TPL, the color mixing prevention member MBM may more effectively perform a function of masking light.

The color mixing prevention member MBM prevents light mixing between the subpixels PXS to a certain degree. However, when an amount of light, which is emitted from the light-emitting layer EML and is absorbed by the color mixing prevention member MBM, is increased, display efficiency of the display device is decreased. When the light-emitting layer EML inefficiently emits too much light, power consumption may be increased, and degradation of the light-emitting layer EML may also be accelerated. Therefore, an area of the emission region EMA (meaning a planar area) may be designed in consideration of a directional angle of light emitted from the light-emitting layer EML. For example, when the area of the emission region EMA is greater than an area of a light outputting region TA corresponding thereto, not only light traveling in a direction inclined outward but also a portion of light vertically traveling may be absorbed by the color mixing prevention member MBM, which may be disadvantageous in terms of light efficiency.

From this perspective, the area of the emission region EMA may be less than or equal to the area of the light outputting region TA corresponding thereto. In addition, in a plan view, each side of the emission region EMA may overlap each side of the light outputting region TA (when the area of the light outputting region TA is equal to the area of the emission region EMA) or may be disposed inwardly from each side of the light outputting region TA (when the area of the light outputting region TA is greater than that of the emission region EMA). However, exemplary implementations are not limited thereto, and due to an alignment error or the like, a portion of the side of the light outputting region TA may be positioned inwardly from the side of the corresponding emission region EMA.

When the emission region EMA has an area smaller than that of the light outputting region TA and the emission region EMA and the light outputting region TA overlap each other, distances between each of the sides of the emission region EMA and a corresponding one of the sides of the corresponding light outputting region TA may be uniform along a circumference thereof, but the exemplary implementations are not limited thereto.

The distance between each of the sides of the emission region EMA and a corresponding one of the sides of the light outputting region TA may be different for each subpixel PXS. For example, in the first subpixel PXS_1 and the second subpixel PXS_2, an area of the light outputting region TA is greater than an area of the emission region EMA, and in a plan view, distances between the sides of the light outputting region TA and the sides of the emission region EMA are the same. On the other hand, in the third subpixel PXS_3, an area of the light outputting region TA may be equal to an area of the emission region EMA, and thus, each side of the light outputting region TA may overlap each side of the emission region EMA.

Each of the emission region EMA and the light outputting region TA is related to an aperture ratio of the display device. The aperture ratio of the display device is determined by the amount of light that passes through the total area in a plan view. The emission region EMA is a region in which the light-emitting layer EML defined by the pixel definition film PDL is disposed, and corresponds to an opening of the first display substrate 10. An aperture ratio of the first display substrate 10 may be calculated as a ratio of an area occupied by the emission region EMA to the total area of a display region of the first display substrate 10. The light outputting region TA is a region in which the color control layer WCL or TPL defined by the color mixing prevention member MBM is disposed, and corresponds to an opening of the second display substrate 20. An aperture ratio of the second display substrate 20 may be calculated as a ratio of an area occupied by the light outputting region TA to the total area of a display region of the second display substrate 20. In an exemplary embodiment, the aperture ratio of the second display substrate 20 may be about 50% or more but is not limited thereto. An upper limit of the aperture ratio of the second display substrate 20 is not limited but may be, for example, about 70%, about 60%, or about 55%. An opening of each subpixel PXS may include both the emission region EMA and the light outputting region TA which overlap each other. The opening of the subpixel PXS may be defined as the light outputting region TA based on a display surface through which light is emitted.

The shape and arrangement of the opening of the subpixel PXS in one pixel PX may influence not only luminance and luminous efficiency of the display device but also color reproducibility thereof. This will be described in detail with reference to FIGS. 6 and 7.

Figure 6:
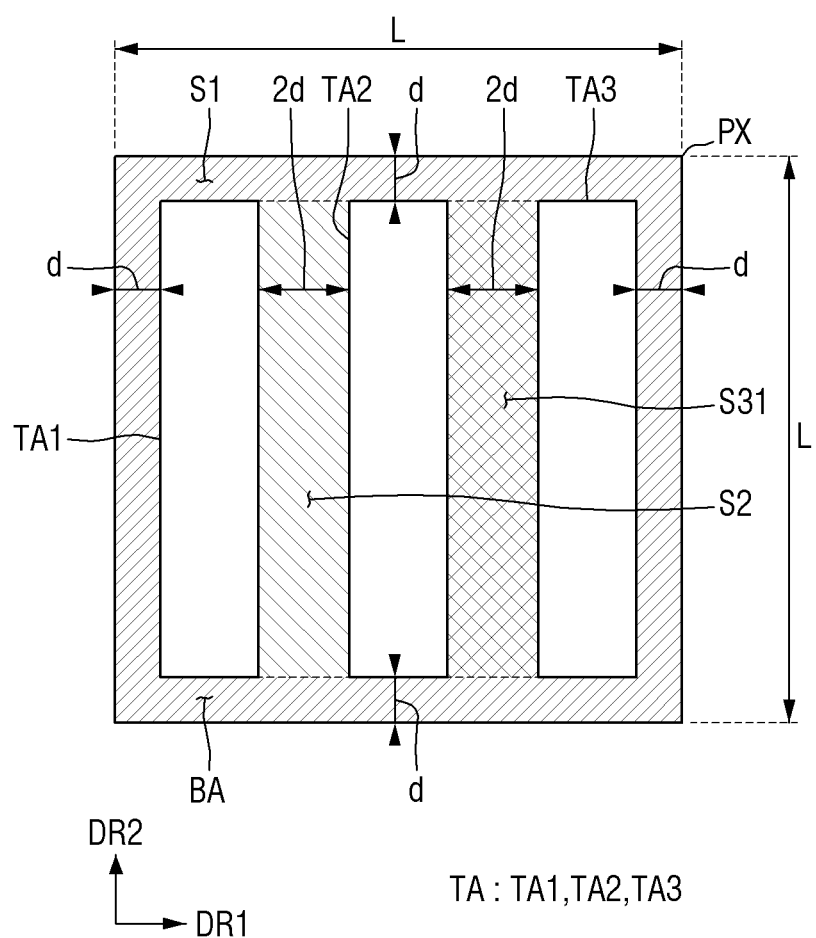
FIGS. 6 and 7 are top, plan views illustrating exemplary embodiments of an arrangement of subpixel openings.
Figure 7:
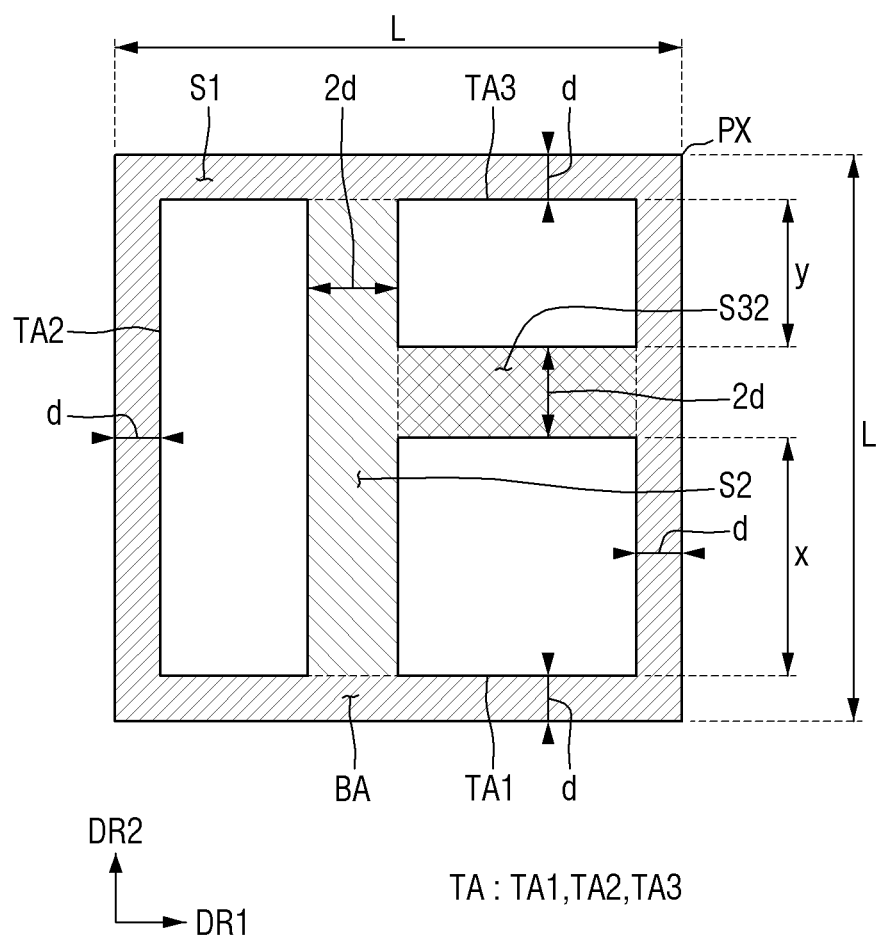

FIGS. 6 and 7 are top, plan views illustrating exemplary embodiments of an arrangement of subpixel openings. In FIGS. 6 and 7, openings (that is, light outputting regions TA) of three subpixels PXS are formed per one pixel PX with a horizontal side and a vertical side that each have a length of L. As described above, in the illustrated exemplary embodiment, the opening of the subpixel PXS is used to have the same concept as the light outputting region TA of the subpixel PXS.

FIG. 6 illustrates a stripe type arrangement in which all the light outputting regions TA of three subpixels PXS have a generally rectangular shape. All the light outputting regions TA of three subpixels PXS of FIG. 6 have a generally rectangular shape in which a vertical side is longer than a horizontal side, and have the same shape and area. FIG. 7 illustrates a case in which the light outputting regions TA of three subpixels PXS have different shapes and illustrates one arrangement so-called an s-stripe type. In FIG. 7, a first light outputting region TA1 has a generally square shape, a second light outputting region TA2 has a generally rectangular shape in which a vertical side is longer than a horizontal side, and a third light outputting region TA3 has a generally rectangular shape in which a horizontal side is longer than a vertical side. In the illustrated exemplary embodiment, each side of the light outputting region TA of the subpixel PXS is substantially parallel to a horizontal or vertical side of a pixel PX.

In the arrangements of FIGS. 6 and 7, the light outputting region TA of each subpixel PXS is surrounded by a light blocking region BA. The light outputting regions TA of adjacent subpixels PXS are spaced apart from each other by the width of the light blocking region BA. The width of the light blocking region BA is related to a design margin of the light outputting region TA, prevention of color mixing between adjacent subpixels PXS, or the like. As the width of the light blocking region BA is increased, it may be advantageous to prevent color mixing. When the width of the light blocking region BA is different for each section, a concern about color mixing may be influenced by a minimum width of the light blocking region BA. For convenience of description, FIGS. 6 and 7 illustrate a case in which the width of the light blocking region BA is substantially uniform along an extending direction thereof.

An area of the light outputting region TA is decreased by as much as an area of the light blocking region BA, and thus, an aperture ratio of the pixel PX is decreased. A larger area of the light blocking region BA may be disadvantageous in terms of luminance. Therefore, within a range in which the light blocking region BA has a width suitable for preventing color mixing, the area of the light blocking region BA may be minimized to prevent a decrease in luminance, and the area of the light outputting region TA of the subpixel PXS may be increased as widely as possible.

When a limit width of the light blocking region BA for preventing color mixing is 2d, in order to maximize an area of the opening of the subpixel PXS, all of distances between the openings of adjacent subpixels PXS in the first and second directions DR1 and DR2 may be set to 2d. The distance of 2d may be maintained not only between the light outputting regions TA of the subpixels PXS disposed in one pixel PX but also between the light outputting regions TA of adjacent subpixels PXS included in different pixels PX. Therefore, a distance between a side of the light outputting region TA of the subpixel PXS adjacent to a boundary of the pixel PX and the boundary of the pixel PX may be set to d.

In comparison between areas of the light blocking regions BA of FIGS. 6 and 7, portions (see S1) of the light blocking regions BA positioned at edges of the pixels PX, and portions (see S2) of the light blocking regions BA crossing inside of the pixels PX in the first direction DR1 are common and have the same area. In the case of the remaining portions S31 and S32, portion S31 of FIG. 6 has an area of [(L−2d)*2d], and portion S32 of FIG. 7 has an area of [x*2d]. Here, x refers to a length of one side of the light outputting region TA of the first subpixel PXS_1 and has a value smaller than (L−2d) by (y+2d). Here, y refers to a length of a vertical side of the third light outputting region TA3 and has a positive value. Since portion S32 of FIG. 7 has a value smaller than that of portion S31 of FIG. 6, an area of the light blocking region BA in the pixel PX of FIG. 7 is smaller than an area of the light blocking region BA in the pixel PX of FIG. 6. Therefore, an s-stripe type arrangement of the pixel PX may secure an aperture ratio higher than that of a stripe type arrangement of the pixel PX.

The s-stripe type arrangement of FIG. 7 has an advantage in terms of luminance as compared with the stripe type arrangement but has a certain limitation in freely adjusting the area of the opening of each subpixel PXS.

For example, in the stripe type arrangement of FIG. 6, the light outputting regions TA of three subpixels PXS may also be formed to have the same area or different areas. Even when the light outputting regions TA are formed to have different areas, any one of the light outputting regions TA of the subpixel PXS may be freely designed to have a larger area.

On the other hand, in the s-stripe type arrangement of FIG. 7 in which the light outputting region TA1 having the generally square shape and the light outputting regions TA2 and TA3 having the generally rectangular shape are mixed, it is difficult to form the light outputting regions TA of each subpixel PXS so as to have the same area. The first light outputting region TA1 having the generally square shape has an area greater than that of the third light outputting region TA3 having the generally rectangular shape in which the horizontal side is longer than the vertical side. The second light outputting region TA2, which has the generally rectangular shape in which the vertical side is longer than the horizontal side, may be formed to have a size greater than that of the first light outputting region TA1 having the generally square shape. However, in this case, sizes of the remaining light outputting regions TA1 and TA3 may be considerably decreased. In this case, for example, the size of the second light outputting region TA2, which has the generally rectangular shape in which the vertical side is longer than the horizontal side, may be greater than or equal to twice the size of the third light outputting region TA3 having the generally rectangular shape in which the horizontal side is longer than the vertical side. In order to adjust an area deviation between the openings of the subpixels PXS in the pixel PX so as to not be too large, preferably, the first light outputting region TA1 having the generally square shape may be formed to have the largest size.

The area of the opening of each subpixel PXS and the area of the emission region EMA corresponding to the opening are related not only to the luminance and efficiency of the subpixel PXS but also to color reproducibility thereof.

Figure 8:
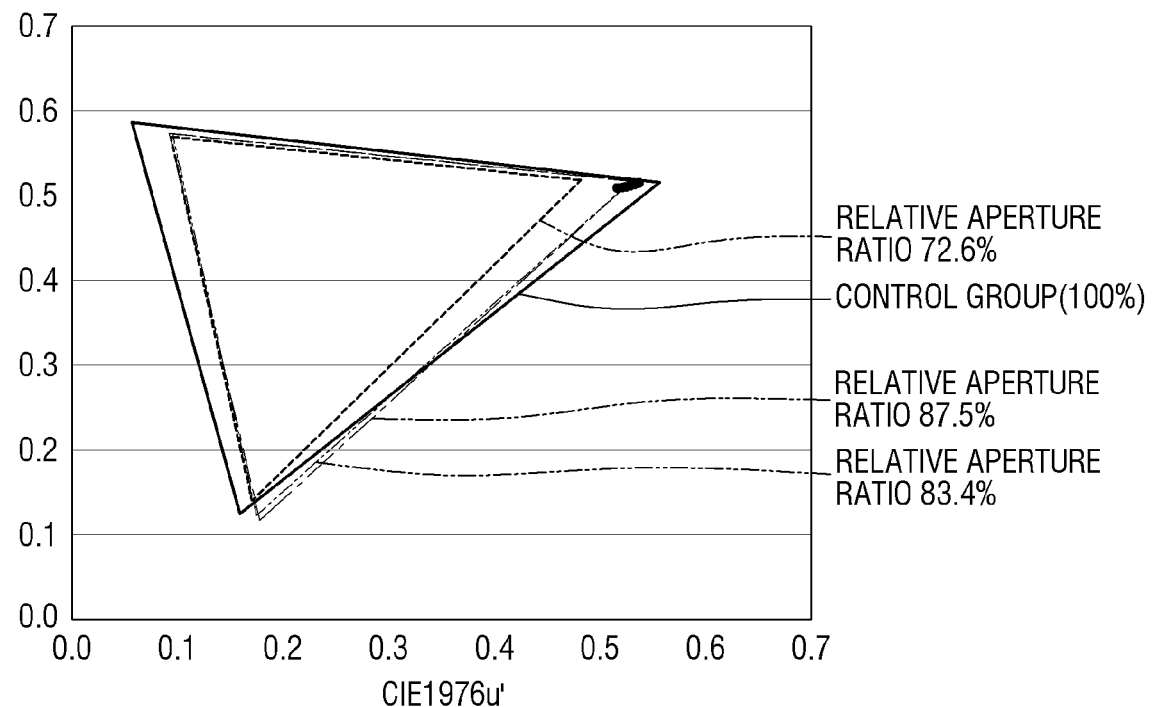
FIG. 8 is a graph depicting a shift of color coordinates "CIE1976v'" for each relative aperture ratio "CIE1976u'" of the display device according to various exemplary embodiments.

FIG. 8 is a graph depicting a shift of color coordinates "CIE1976v'" for each relative aperture ratio "CIE1976u'" of the display device. A relative aperture ratio of FIG. 8 was calculated as a ratio of an aperture ratio of a corresponding example to an aperture ratio of a control group (a ratio of an area occupied by light outputting regions TA of three subpixel PXS to an area of a pixel PX). The relative aperture ratio of each example was adjusted in such a manner that a width of a light blocking region BA was increased as compared with the control group. A change rate of a relative aperture ratio of the pixel PX was set to be approximately equal to a relative change rate of an area of the light outputting region TA of each subpixel PXS. For example, when the aperture ratio of the pixel PX is 85.7% of an aperture ratio of the control group, the area of the light outputting region TA of each subpixel PXS is also decreased to about 85.7% of an area of the control group. All of the subpixels PXS have a stripe type having a generally rectangular shape, and the areas of the emission regions EMA were decreased together in proportion to a decrease in aperture ratio.

Referring to FIG. 8, a change in color coordinates was measured according to a decrease in aperture ratio. In the case of an example having an aperture ratio of 72.6% of the aperture ratio of the control group, green (G) color coordinates were changed by about 1.4%, and blue (B) color coordinates were changed by about 2.5%. On the other hand, red (R) color coordinates were changed by about 8.8% and thus showed a color coordinate shift rate which is much higher than that of other colors. Such a result indicates that an area of the light outputting region TA of a red subpixel PXS is abruptly decreased, and thus, as an area of a corresponding emission region EMA is decreased, color coordinates are abruptly changed.

Assuming that each side of an emission region EMA inside a light outputting region TA is spaced a certain distance apart from each side of the light outputting region TA, an area of an emission region EMA inside a light outputting region TA having a generally square shape is greater than an area of an emission region EMA inside a light outputting region TA having a generally rectangular shape, which has the same area as that of the light outputting region TA having the generally square shape. That is, even when an area of an opening of a subpixel PXS having a generally square shape and an area of an opening of a subpixel PXS having a generally rectangular shape are decreased at the same area ratio, an area decrease rate of an emission region EMA disposed inside the generally square shape is smaller. Therefore, when a red subpixel PXS having a high color coordinate shift rate according to a decrease in area is disposed in a light outputting region TA of a subpixel PXS having a generally square shape, which has a small area decrease rate, it is possible to easily control color reproducibility.

Hereinafter, an arrangement of a subpixel PXS of a display device according to exemplary embodiments in consideration of the aperture ratio and color reproducibility will be described.

Figure 9:
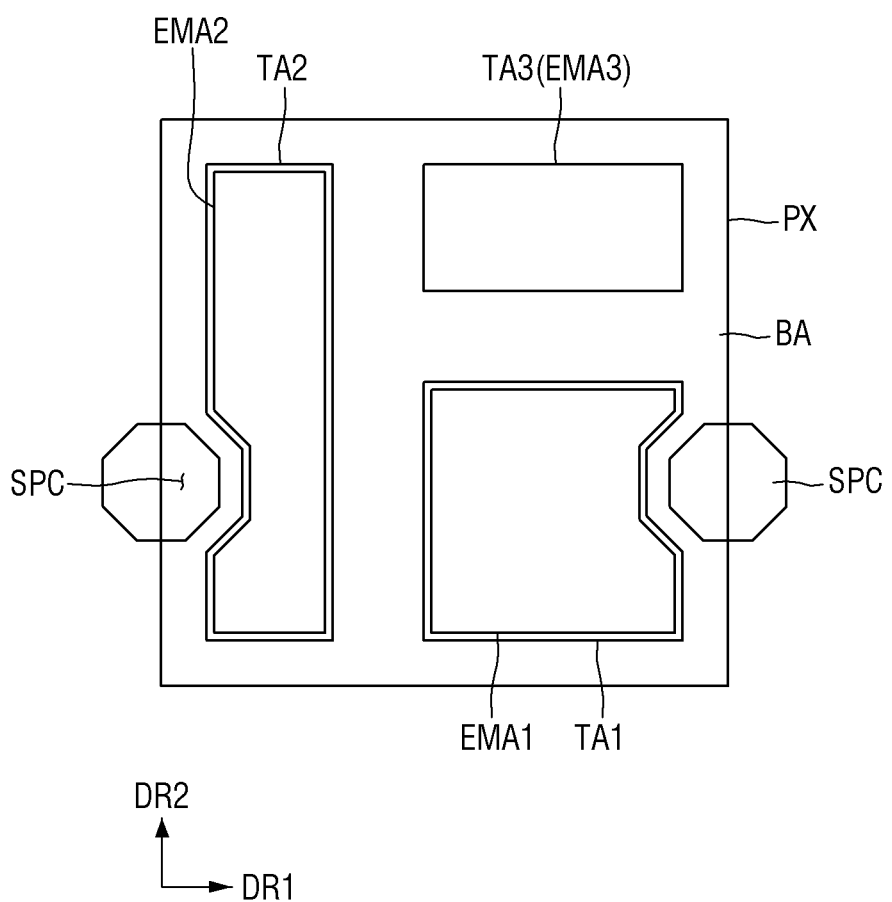
FIG. 9 is a top, plan view illustrating an exemplary embodiment of light outputting regions of one representative pixel of the display device.

FIG. 9 is a top, plan view illustrating an exemplary embodiment of light outputting regions of one representative pixel of the display device constructed according to principles of the invention.

Each side of a pixel PX and each side of a light outputting region TA of a subpixel PXS may approximately extend in a first direction DR1 or a second direction DR2. In each generally quadrangular shape, a side which extends in the first direction DR1 and is relatively positioned at an upper side in a plan view is referred to as a first horizontal side, and a side which is opposite to the first horizontal side and is relatively positioned at a lower side in a plan view is referred to as a second horizontal side. In addition, a side which extends in the second direction DR2 and is relatively positioned at a left side in a plan view is referred to as a first vertical side, and a side which is opposite to the first vertical side and is relatively positioned at a right side in a plan view is referred to as a second vertical side.

A first light outputting region TA1 of a first subpixel PXS_1 may have a generally square shape. A second light outputting region TA2 of a second subpixel PXS_2 may have a generally rectangular shape in which a vertical side is longer than a horizontal side. A third light outputting region TA3 of a third subpixel PXS_3 may have a generally rectangular shape in which a horizontal side is longer than a vertical side. A vertical side of the second light outputting region TA2 may be longer than horizontal and vertical sides of the first light outputting region TA1 and a horizontal side of the third light outputting region TA3. The horizontal side of the third light outputting region TA3 may have substantially the same length as the horizontal side of the first light outputting region TA1. An area of the third light outputting region TA3 may be smaller than an area of the first light outputting region TA1 and an area of the second light outputting region TA2. In addition, the area of the first light outputting region TA1 may be greater than the area of the second light outputting region TA2.

The first light outputting region TA1 may be disposed at a lower right side of the pixel PX. The second horizontal side of the first light outputting region TA1 faces the second horizontal side of the pixel PX. The second vertical side of the first light outputting region TA1 faces the second vertical side of the pixel PX.

The second light outputting region TA2 may be disposed at a left side of the pixel PX. The first vertical side of the second light outputting region TA2 faces the first vertical side of the pixel PX. The second horizontal side of the second light outputting region TA2 faces the second horizontal side of the pixel PX. The first horizontal side of the second light outputting region TA2 faces the first horizontal side of the pixel PX.

The third light outputting region TA3 may be disposed at an upper right side of the pixel PX. The first horizontal side of the third light outputting region TA3 faces the first horizontal side of the pixel PX. The second vertical side of the third light outputting region TA3 faces the second vertical side of the pixel PX.

In addition, the first horizontal side of the first light outputting region TA1 faces the second horizontal side of the third light outputting region TA3. The second vertical side of the second light outputting region TA2 faces the first vertical side of the first light outputting region TA1 and the first vertical side of the third light outputting region TA3.

In the above-described facing relationship of the sides of the light outputting regions TA or the sides of the pixel PX, other light outputting regions TA may not be disposed between the facing sides, and a light blocking region BA may be disposed between the above-described facing sides. As described above, the width of the light blocking region BA is related to a design margin of the light outputting region TA, prevention of color mixing between adjacent subpixels PXS, or the like. In consideration of such variables, the minimum width of the light blocking region BA may be about 22 μm or more, preferably about 24 μm or more, and more preferably about 26 μm or more. The upper limit of the minimum width of the light blocking region BA is not limited but may be, for example, about 28 μm or less. The upper limit of the minimum width of the light blocking region BA may be adjusted at a degree at which an aperture ratio of a second display substrate 20 is maintained at about 50% or more.

In some exemplary embodiments, a spacer SPC may be disposed in the light blocking region BA. The spacer SPC may be disposed in the light blocking region BA and may not overlap the light outputting region TA. In an exemplary embodiment, one spacer SPC may be disposed in one pixel PX. For example, one spacer SPC may be disposed at the first vertical side of the pixel PX, and another spacer SPC may be disposed at the second vertical side of the pixel PX. One spacer SPC may be disposed over two adjacent pixels PX. The diameter of the spacer SPC may be greater than the minimum width of the light blocking region BA.

The width of the light blocking region BA in a region in which the spacer SPC is disposed may be greater than the minimum width of the light blocking region BA. Since the width of the light blocking region BA is increased due to the spacer SPC, the shape of a side of the light outputting region TA of an adjacent subpixel PXS may be changed, and thus, the corresponding area of the light outputting region TA may be decreased. In an exemplary embodiment, the spacer SPC may be disposed adjacent to the vertical side of the pixel PX. Specifically, the first vertical side of the second light outputting region TA2 may be disposed adjacent to the spacer SPC positioned at a left side of the pixel PX, and the second vertical side of the first light outputting region TA1 may be disposed adjacent to the spacer SPC positioned at a right side of the pixel PX. The first vertical side of the second light outputting region TA2 may include a recessed portion recessed inwardly (that is, one side in the first direction DR1) so as to detour along a profile of the adjacent spacer SPC. In addition, the second vertical side of the first light outputting region TA1 may also include a recessed portion recessed inwardly (that is, the other side in the first direction DR1) so as to detour along a profile of the adjacent spacer SPC.

An emission region EMA may have a shape similar to that of the light outputting region TA in a plan view and may be disposed inside the light outputting region TA to overlap the light outputting region TA.

The emission region EMA (hereinafter, a first emission region EMA1) of the first subpixel PXS_1 is disposed inside the first light outputting region TA1. The distance between each side of the first emission region EMA1 and each side of the first light outputting region TA1 may be in a range of about 4 μm to about 12 μm. In an exemplary embodiment, the distance between each side of the first emission region EMA1 and each side of the first light outputting region TA1 may be about 8 μm. In other words, lengths of horizontal and vertical sides of the first light outputting region TA1 may be about 16 μm greater than lengths of corresponding horizontal and vertical sides of the first emission region EMA1.

The emission region EMA (hereinafter, a second emission region EMA2) of the second subpixel PXS_2 is disposed inside the second light outputting region TA2. The distance between each side of the second emission region EMA2 and each side of the second light outputting region TA2 may be in a range of about 4 μm to about 12 μm. In an exemplary embodiment, the distance between each side of the second emission region EMA2 and each side of the second light outputting region TA2 may be about 8 μm. Distances between the sides of the emission region EMA and the sides of the light outputting region TA may be the same in the first subpixel PXS_1 and the second subpixel PXS_2.

The emission region EMA (hereinafter, a third emission region EMA3) of the third subpixel PXS_3 may have the same size as that of the third light outputting region TA3. Each side of the third emission region EMA3 and each side of the third light outputting region TA3 may overlap each other. However, the exemplary implementations are not limited thereto, and even in the case of the third subpixel PXS_3, the distance between the side of the emission region EMA3 and the side of the light outputting region TA3 may be the same as that of the first subpixel PXS_1 or the second subpixel PXS_2.

The arrangement of the pixel PX of FIG. 9 may be an s-stripe type arrangement including the light outputting region TA having the generally square shape, thereby increasing the aperture ratio. In addition, the first subpixel PXS_1 displaying a red color, which is sensitive to color reproducibility, may be disposed in the light outputting region TA having the generally square shape, which has the largest area, thereby easily controlling color reproducibility.

Figure 10:
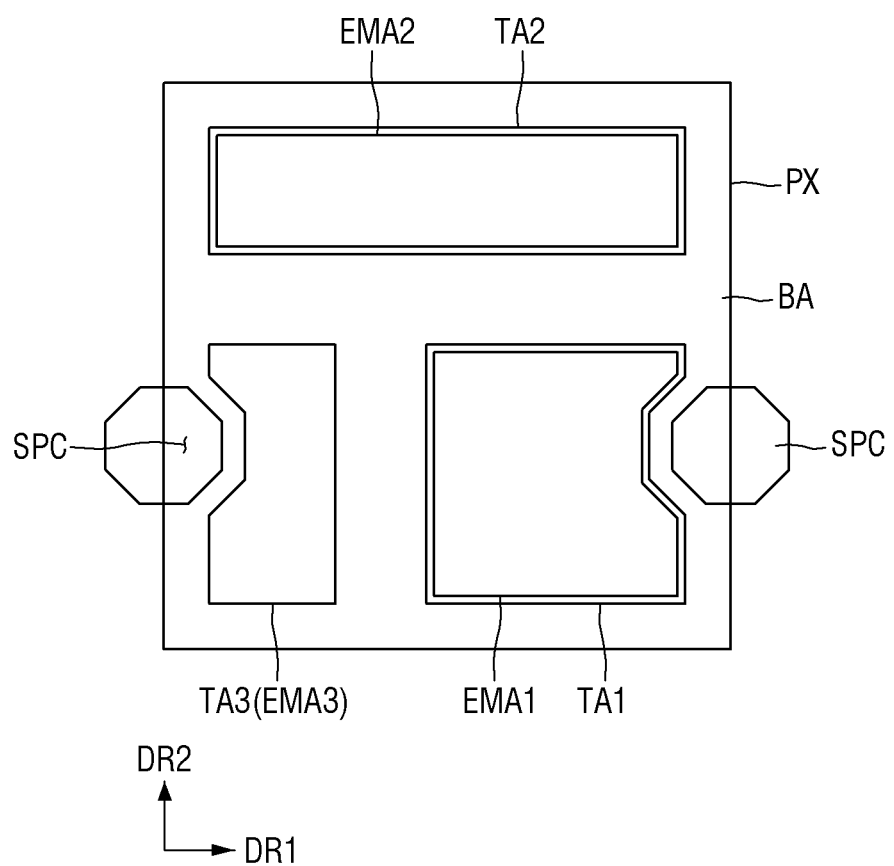
FIG. 10 is a top, plan view illustrating an exemplary embodiment of light outputting regions of one representative pixel of the display device.

FIG. 10 is a top, plan view illustrating an exemplary embodiment of light outputting regions of one representative pixel of the display device.

Referring to FIG. 10, the display device according to the exemplary embodiment is the same as the exemplary embodiment of FIG. 9 in that the display device has an s-stripe type arrangement and a first light outputting region TA1 is disposed at a lower right side of a pixel PX and has a generally square shape. However, the exemplary embodiment of FIG. 10 is different from the exemplary embodiment of FIG. 9 in that the arrangement of a second light outputting region TA2 and a third light outputting region TA3 is reversed as compared with the exemplary embodiment of FIG. 9.

Specifically, the second light outputting region TA2 is disposed at an upper side of the pixel PX, and the third light outputting region TA3 is disposed at a lower left side of the pixel PX. The second light outputting region TA2 has a generally rectangular shape in which a horizontal side is longer than a vertical side, and the third light outputting region TA3 has a generally rectangular shape in which a vertical side is longer than a horizontal side. A horizontal side of the second light outputting region TA2 may be longer than horizontal and vertical sides of the first light outputting region TA1 and a vertical side of the second light outputting region TA2. The vertical side of the third light outputting region TA3 may have substantially the same length as the vertical side of the first light outputting region TA1. The area of the third light outputting region TA3 may be smaller than an area of the first light outputting region TA1 and the area of the second light outputting region TA2. The area of the first light outputting region TA1 may be greater than the area of the second light outputting region TA2.

A second horizontal side and a second vertical side of the first light outputting region TA1 face a second horizontal side and a second vertical side of the pixel PX, respectively. A first horizontal side of the first light outputting region TA1 faces a second horizontal side of the second light outputting region TA2, and a first vertical side thereof faces a second vertical side of the third light outputting region TA3.

A first horizontal side, a first vertical side, and a second vertical side of the second light outputting region TA2 face a first horizontal side, a first vertical side, and the second vertical side of the pixel PX, respectively. The second horizontal side of the second light outputting region TA2 faces the first horizontal side of the first light outputting region TA1 and a first vertical side of the third light outputting region TA3.

The first vertical side and the second horizontal side of the third light outputting region TA3 face the first vertical side and the second horizontal side of the pixel PX, respectively. The first horizontal side of the third light outputting region TA3 faces the second horizontal side of the second light outputting region TA2, and the second vertical side of the third light outputting region TA3 faces the first vertical side of the first light outputting region TA1.

Spacers SPC may be disposed at the vertical sides of the pixel PX. As a result, the second vertical side of the first light outputting region TA1 and the first vertical side of the third light outputting region TA3, which are disposed adjacent to the spacers SPC, may include recessed portions recessed inwardly so as to detour along profiles of the spacers SPC.

The arrangement of the pixel PX of FIG. 10 may also be an s-stripe type arrangement including the light outputting region TA having the generally square shape, like the arrangement of the pixel PX of FIG. 9, thereby increasing the aperture ratio. In addition, the first subpixel PXS_1 may be disposed in the light outputting region TA having the generally square shape, which has the largest area, thereby easily controlling color reproducibility.

Figure 11:
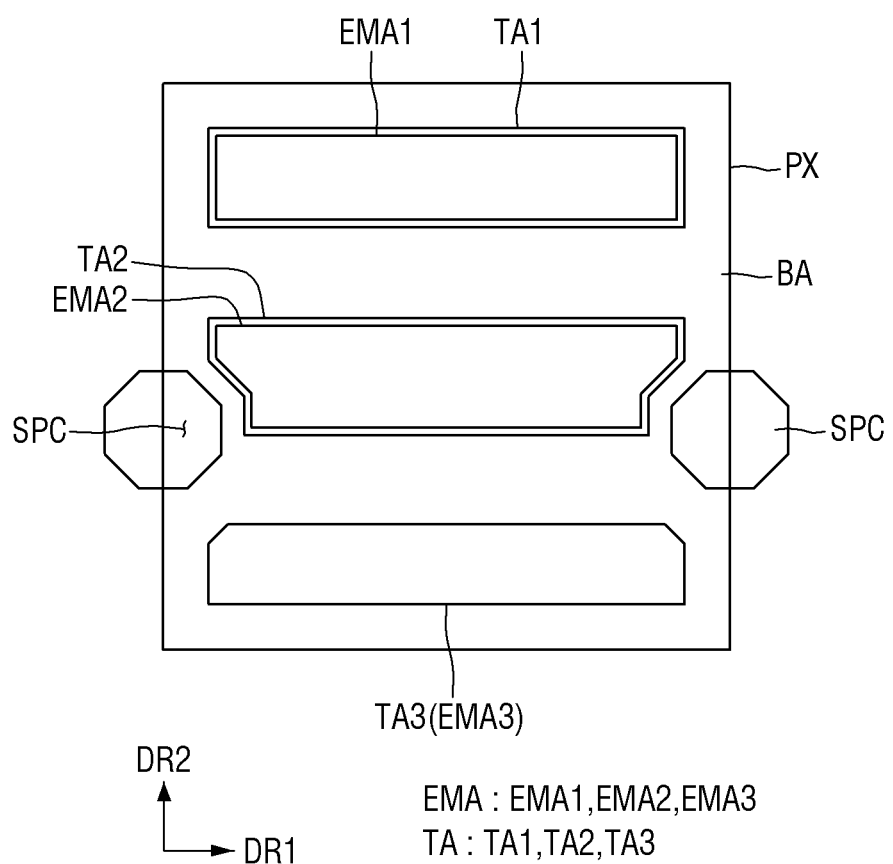
FIGS. 11 and 12 are top, plan views illustrating exemplary embodiments of light outputting regions of two representative pixel arrangements.
Figure 12:
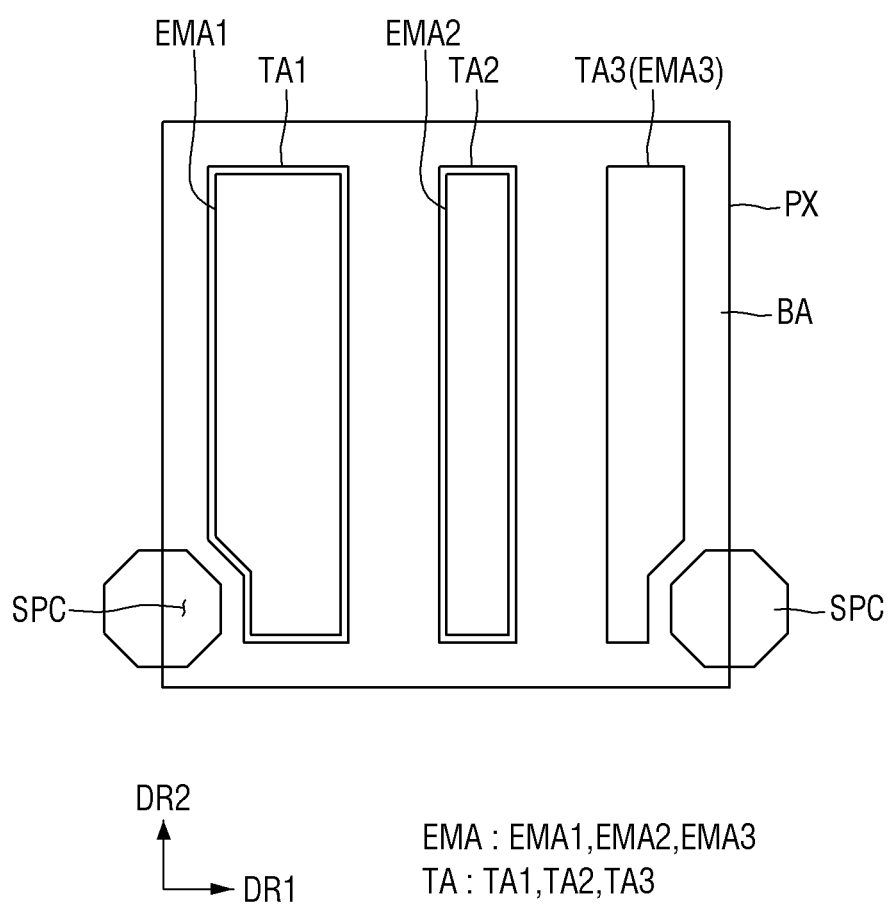

FIGS. 11 and 12 are top plan views illustrating exemplary embodiments of light outputting regions of two representative pixel arrangements. FIG. 11 illustrates an example of a horizontal stripe type arrangement of a pixel PX having a generally rectangular shape in which a horizontal side is longer than a vertical side. FIG. 12 illustrates an example of a vertical stripe type arrangement of a pixel PX having a generally rectangular shape in which a vertical side is longer than a horizontal side.

Aperture ratios of the stripe type arrangements of the pixel PX of FIGS. 11 and 12 and the s-stripe type arrangements of the pixel PX of FIGS. 9 and 10 were measured, and measurement results were shown in Tables 1 and 2 below.

TABLE 1

| Arrangement of pixel PX | First emission region (red) | Second emission region (green) | Third emission region (blue) | Aperture ratio of first display substrate |
|---|---|---|---|---|
| Horizontal stripe | 13.40 | 10.22 | 9.62 | 33.24 |
| Vertical stripe | 13.40 | 10.01 | 9.62 | 33.05 |
| S-stripe A | 14.63 | 9.73 | 9.62 | 33.98 |
| 5-stripe B | 14.54 | 10.10 | 9.61 | 34.26 |

TABLE 2

| Arrangement of pixel PX | First light outputting region (red) | Second light outputting region (green) | Third light outputting region (blue) | Aperture ratio of second display substrate | Minimum width of light blocking region (μm) |
|---|---|---|---|---|---|
| Horizontal stripe | 22.36 | 18.63 | 9.62 | 50.62 | 23.5 |
| Vertical stripe | 22.34 | 18.61 | 9.62 | 50.58 | 22.5 |
| S-stripe A | 22.33 | 18.66 | 9.61 | 50.61 | 27.5 |
| S-stripe B | 22.35 | 18.63 | 9.61 | 50.60 | 26.0 |

Table 1 shows an aperture ratio of the first display substrate 10, which is a ratio (%) of an area occupied by the emission region EMA to the total area of the pixel PX. Table 2 shows an aperture ratio of the second display substrate 20, which is a ratio (%) of an area occupied by the light outputting region TA to the total area of the pixel PX. In addition, in Tables 1 and 2, the term "s-stripe A" represents the arrangement of the pixel PX of FIG. 9. The term "s-stripe B" represents the arrangement of the pixel PX of FIG. 10. The term "horizontal stripe" represents the arrangement of the pixel PX of FIG. 11. The term "vertical stripe" represents the arrangement of the pixel PX of FIG. 12.

Referring to Tables 1 and 2, the s-stripe type arrangement ensures a wider minimum width of the light blocking region BA with respect to the same aperture ratio as compared with the stripe type arrangement. Thus, it can be seen that the s-stripe type arrangement is even better at preventing color mixing. In addition, when the minimum widths are the same, it can be seen that an aperture ratio will be higher.

Furthermore, in the s-stripe type arrangement, the first emission region EMA1 has a larger area with respect to the first light outputting region TA1 having the same area when compared to the stripe type arrangement. Therefore, in the above-described s-stripe type arrangements of FIGS. 9 and 10, it can be seen that high color reproducibility may be exhibited by decreasing an area decrease rate of the first emission region EMA1 of the red subpixel PXS which is sensitive to color reproducibility.

Hereinafter, other exemplary embodiments will be described. In the following exemplary embodiments, descriptions of the same components as those of the above-described exemplary embodiments will be omitted or simplified to avoid redundancy, and the differences will be mainly described.

Figure 13:
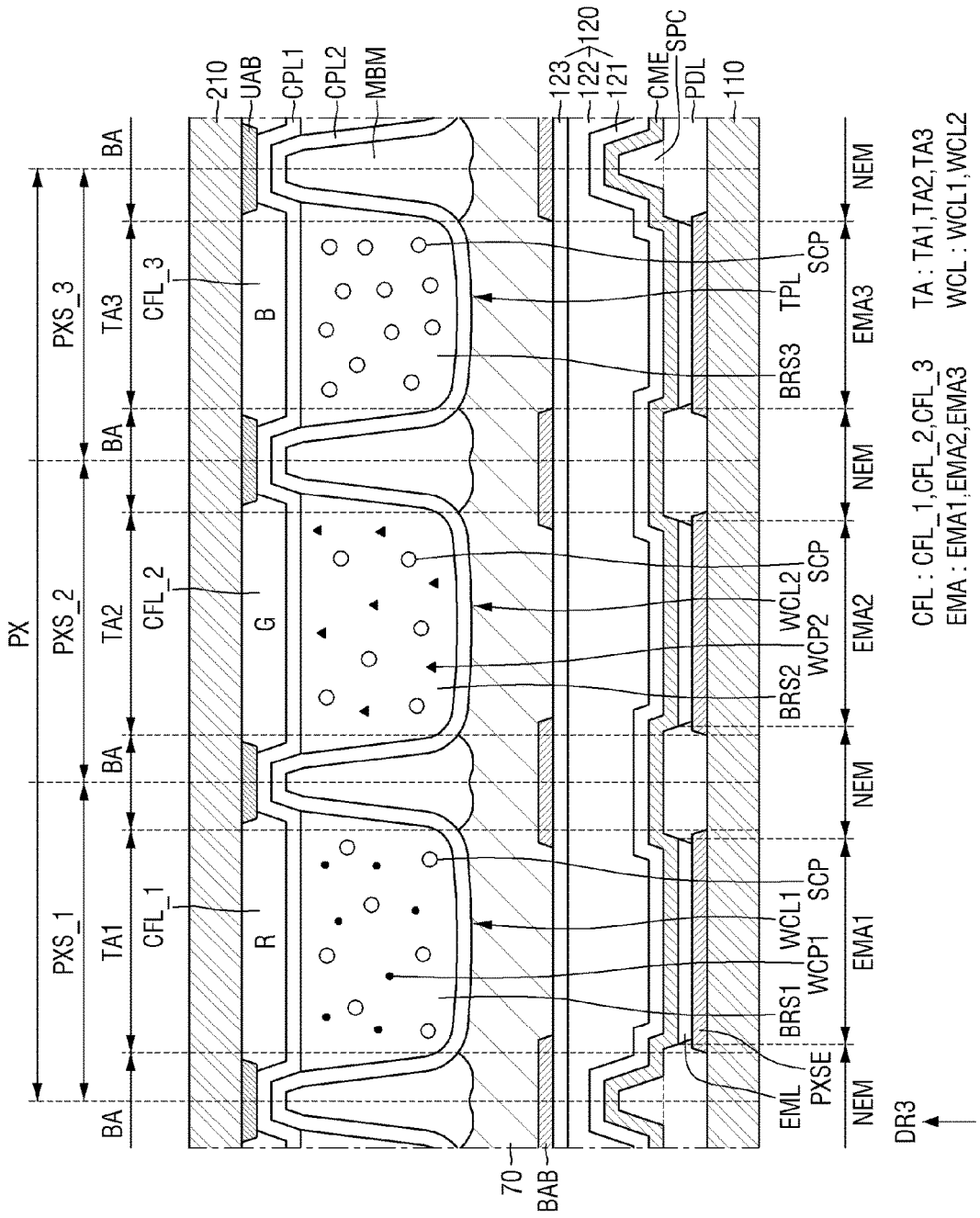
FIG. 13 is a cross-sectional view illustrating another exemplary embodiment of a display device constructed according to principles of the invention.

FIG. 13 is a cross-sectional view illustrating another exemplary embodiment of a display device constructed according to principles of the invention.

Referring to FIG. 13, the display device according to the illustrated exemplary embodiment is different from the exemplary embodiment of FIG. 4 in that a first display substrate further includes a lower light absorbing member BAB.

Specifically, the lower light absorbing member BAB of the first display substrate may be disposed on a thin film encapsulation structure 120. The lower light absorbing member BAB may overlap a pixel definition film PDL. The lower light absorbing member BAB may serve to block light emitted from a light-emitting layer EML from being mixed into a light outputting region TA of an adjacent subpixel PXS. In the illustrated exemplary embodiment, color mixing for each subpixel PXS may be further blocked due to the lower light absorbing member BAB.

The lower light absorbing member BAB may be made of an organic material. In an exemplary embodiment, the lower light absorbing member BAB may include a light absorbing material that absorbs a visible light wavelength band. For example, the lower light absorbing member BAB may be made of a material used as a black matrix of the display device. The lower light absorbing member BAB is a kind of light blocking member. The lower light absorbing member BAB may overlap an upper light absorbing member UAB in a thickness direction thereof.

A width of the lower light absorbing member BAB may be less than or equal to or greater than a width of the pixel definition film PDL. The lower light absorbing member BAB of the first display substrate may define an emission region EMA together with the pixel definition film PDL. For example, when the width of the lower light absorbing member BAB is less than or equal to the width of the pixel definition film PDL thereunder and completely overlaps an inside of the pixel definition film PDL, the emission region EMA may be defined by the pixel definition film PDL. When the width of the lower light absorbing member BAB is greater than the width of the pixel definition film PDL and thus the lower light absorbing member BAB further protrudes outward as compared with the pixel definition film PDL in a plain view, the boundary of the emission region EMA may be defined by the protruding lower light absorbing member BAB. In this case, the aperture ratio of the first display substrate may be reduced by an increased width of the lower light absorbing member BAB.

Figure 14:
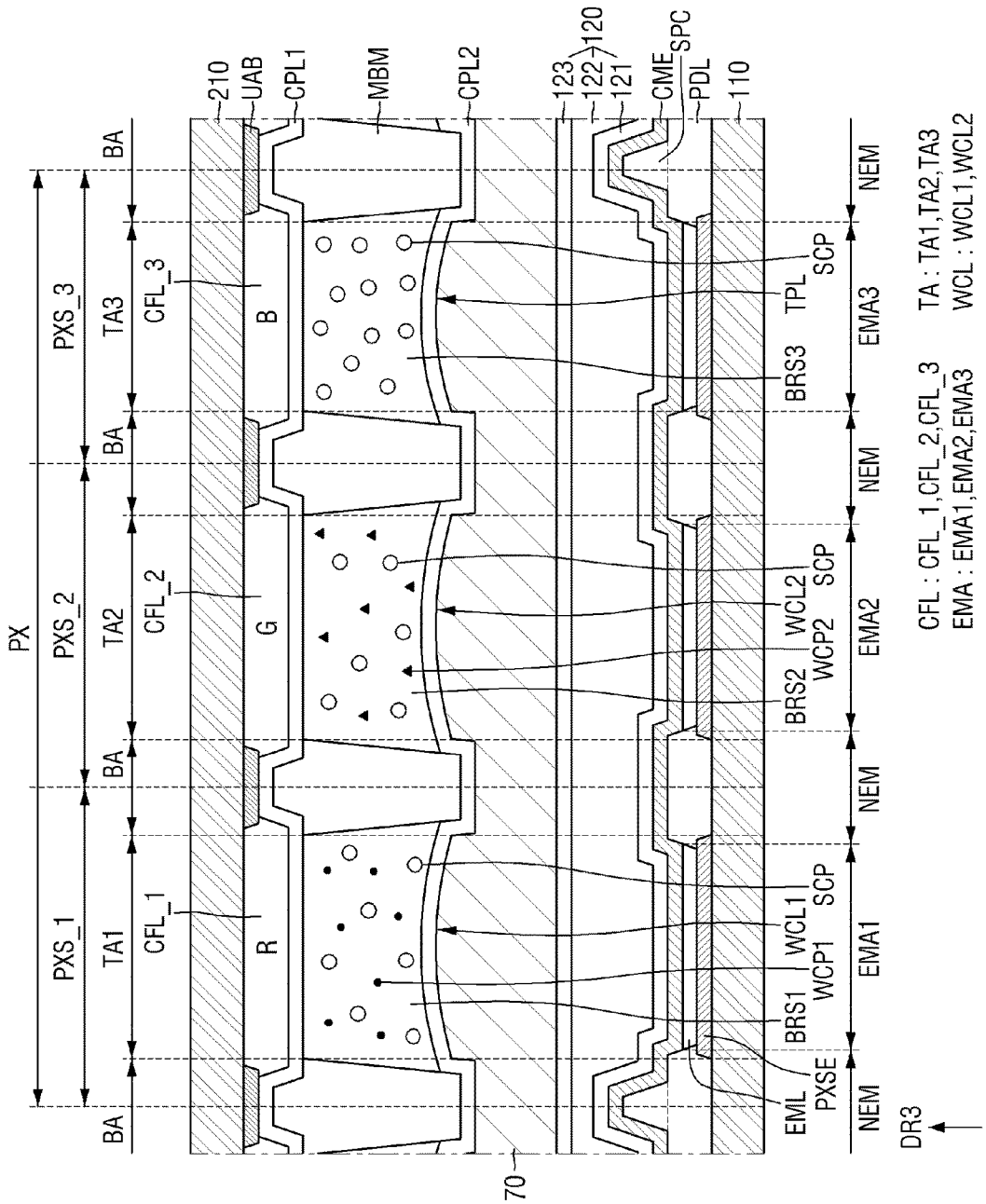
FIG. 14 is a cross-sectional view illustrating another exemplary embodiment of a display device constructed according to principles of the invention.

FIG. 14 is a cross-sectional view illustrating another exemplary embodiment of a display device constructed according to principles of the invention.

Referring to FIG. 14, the display device according to the exemplary embodiment is different from the exemplary embodiment of FIG. 4 in that a color mixing prevention member MBM of a second display substrate serves as a partition forming color control layers WCL and TPL.

That is, the color control layers WCL and TPL are formed in spaces surrounded by the color mixing prevention member MBM. The color control layers WCL and TPL may be formed through inkjet printing or the like.

In the illustrated exemplary embodiment, a first capping layer CPL1 covers not only the color control layers WCL and TPL, but also the color mixing prevention member MBM.

A third capping layer may be further disposed between the color control layers WCL and TPL and the color mixing prevention member MBM. In this case, the third capping layer may be disposed on an a whole surface of the second display substrate and may be in direct contact with a first capping layer CPL1 in a light outputting region TA and be in direct contact with the second capping layer CPL2 at one surface of the color mixing prevention member MBM.

Figure 15:
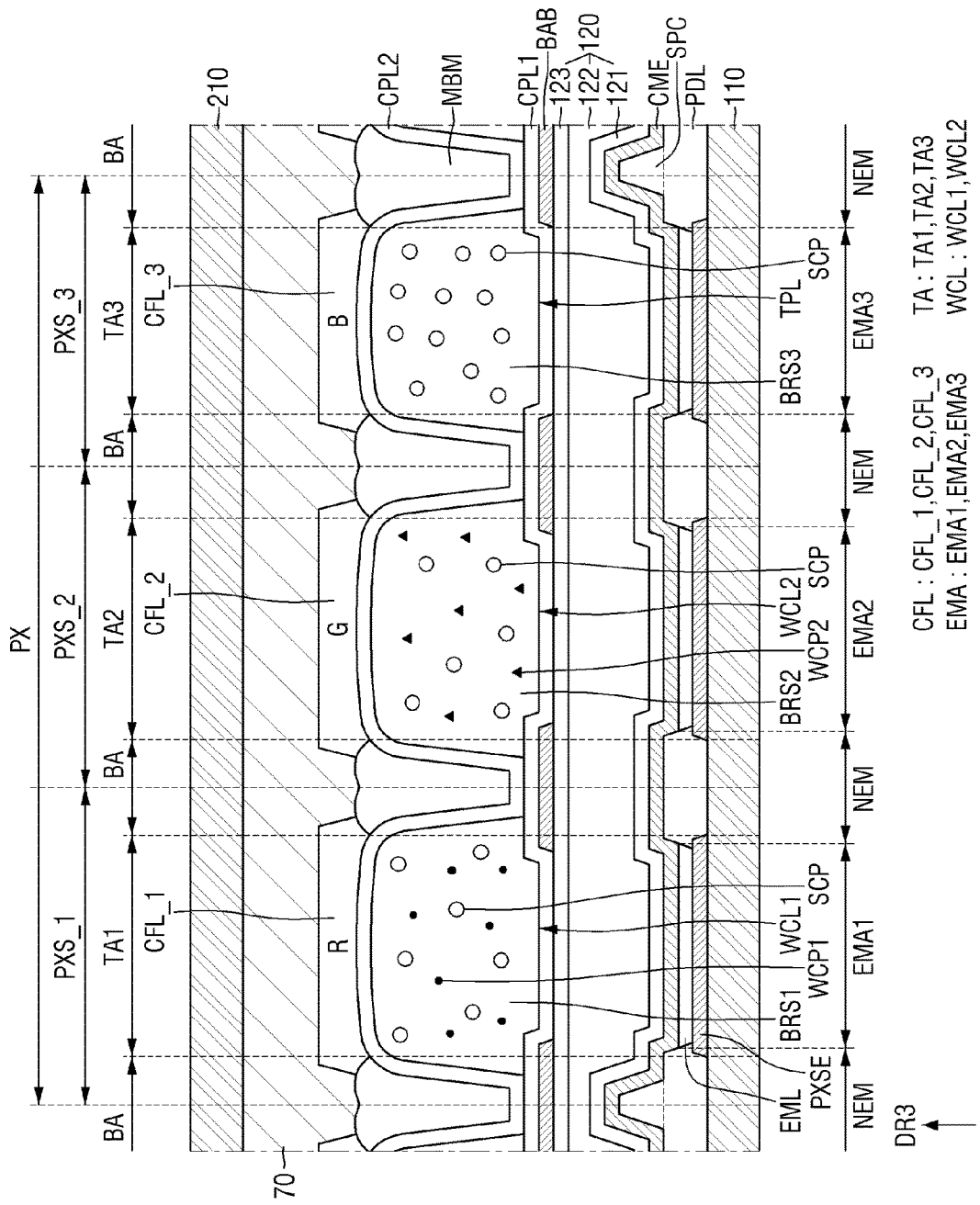
FIG. 15 is a cross-sectional view illustrating still another exemplary embodiment of a display device constructed according to principles of the invention.

FIG. 15 is a cross-sectional view illustrating still another exemplary embodiment of a display device constructed according to principles of the invention.

The exemplary embodiment of FIG. 15 exemplifies that the above-described color control layers WCL and TPL and color mixing prevention member MBM may be sequentially formed on a first substrate 110.

Specifically, a lower light absorbing member BAB is disposed on a thin film encapsulation structure 120. A first capping layer CPL1 is disposed on the lower light absorbing member BAB. The color control layer WCL or TPL is disposed on the first capping layer CPL1 for each subpixel PXS, and a second capping layer CPL2 is disposed on the color control layers WCL and TPL. The color mixing prevention member MBM is disposed in a valley between adjacent color control layers WCL or adjacent color control layers WCL and TPL on the second capping layer CPL2. A color filter layer CFL and an upper light absorbing member UAB may be sequentially disposed above the second capping layer CPL2 and the color mixing prevention member MBM for each subpixel PXS.

In addition, a filling layer 70 may be disposed on the color filter layer CFL and the upper light absorbing member UAB, and a second substrate 210 may be disposed on the filling layer 70.

In the illustrated exemplary embodiment, an emission region EMA may be defined by a pixel definition film PDL and/or the lower light absorbing member BAB. In addition, since the lower light absorbing member BAB is also disposed adjacent to the color mixing prevention member MBM, the light outputting region TA may also be defined by the lower light absorbing member BAB as well as the color mixing prevention member MBM like the emission region EMA.

Figure 16:
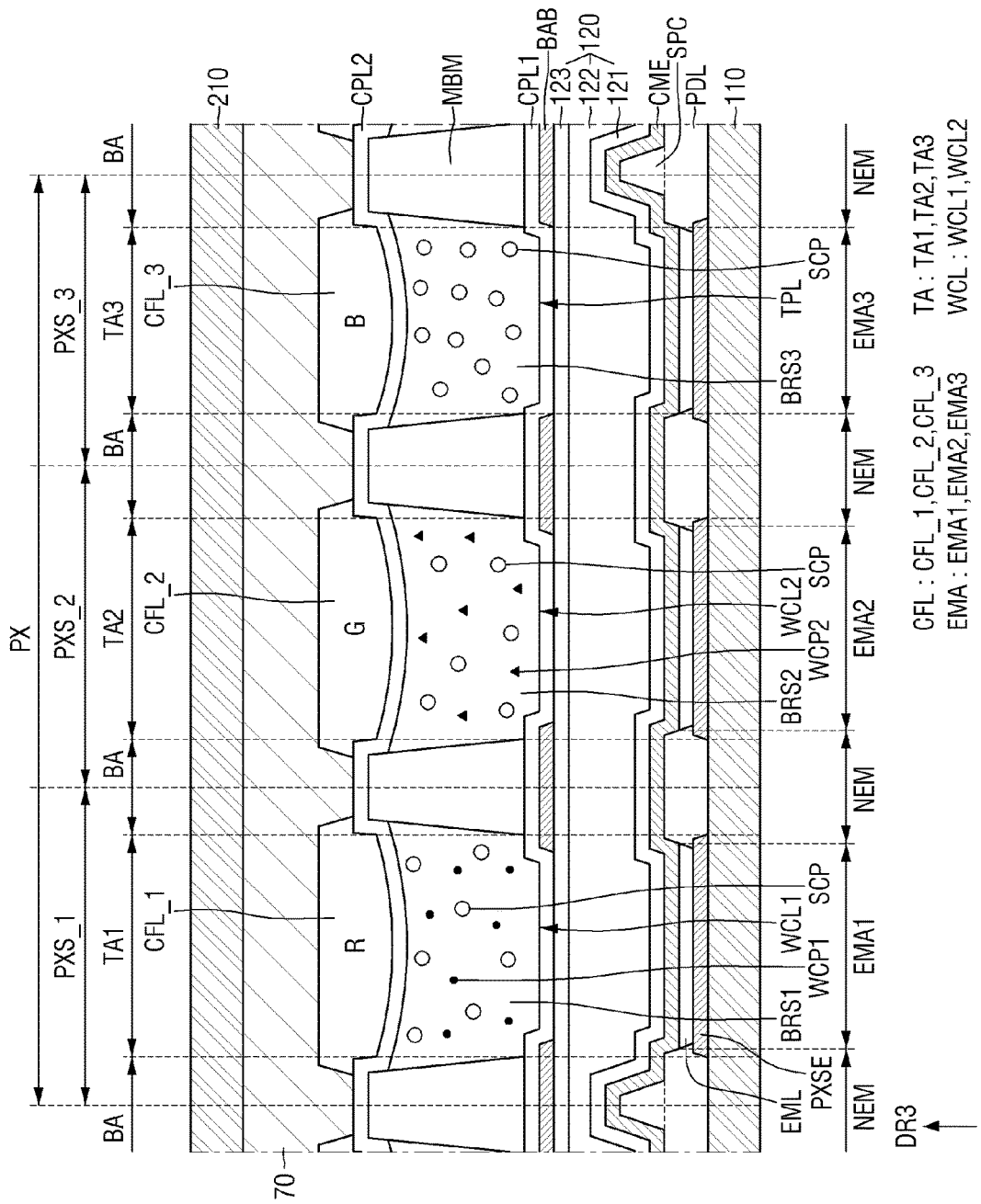
FIG. 16 is a cross-sectional view illustrating yet another exemplary embodiment of a display device constructed according to principles of the invention.

FIG. 16 is a cross-sectional view illustrating yet another exemplary embodiment of a display device constructed according to principles of the invention.

The exemplary embodiment of FIG. 16 is different from the exemplary embodiment of FIG. 15 in that a color mixing prevention member MBM serves as a partition forming color control layers WCL and TPL. That is, the color control layers WCL and TPL are formed in spaces surrounded by the color mixing prevention member MBM. The color control layers WCL and TPL may be formed through inkjet printing or the like.

In the illustrated exemplary embodiment, a second capping layer CPL2 covers not only the color control layers WCL and TPL but also the color mixing prevention member MBM.

A third capping layer may be further disposed between the color control layers WCL and TPL and the color mixing prevention member MBM. In this case, the third capping layer may be disposed on an a whole surface of a second display substrate and may be in direct contact with a first capping layer CPL1 in a light outputting region TA and be in direct contact with the second capping layer CPL2 at one surface of the color mixing prevention member MBM.

As described herein, display devices constructed according to the principles and exemplary embodiments of the invention can exhibit high color reproducibility while having a high aperture ratio.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a pixel including a first subpixel to display a first color, a second subpixel to display a second color, and a third subpixel to display a third color,
   wherein the pixel includes a first light outputting region overlapping the first subpixel, a second light outputting region overlapping the second subpixel, a third light outputting region overlapping the third subpixel, and a light blocking region disposed around each of the first, second, and third light outputting regions,
   the first light outputting region, the second light outputting region, and the third light outputting region are defined by the light blocking region,
   the first light outputting region has a first side, a second side, a third side and a fourth side each defined by the light blocking region;
   as seen in a plan view, the first side having a first portion being a straight line extending in a first direction, a second portion being a straight line extending in the first direction, and an inwardly recessed area between the first portion and the second portion,
   as seen in the plan view, the second side opposing the first side and being a straight line extending continuously in the first direction from one end of the third side to one end of the fourth side,
   as seen in the plan view, the third side being a straight line extending continuously in a second direction from first end of the first side to a first end of the second side, the second direction perpendicular to the first direction, and
   as seen in the plan view, the fourth side opposing the third side and being a straight line extending continuously in the second direction from a second end of the first side to a second end of the second side,
   wherein the inwardly recessed area of the first side is closer to the second side of the first light outputting region than the first portion and second portion of the first side, and the second light outputting region and the third light outputting region each have a rectangular shape,
   wherein a spacer is disposed in the light blocking region and protrudes in a direction where the display device displays, the spacer is positioned adjacent to the first light outputting region, the inwardly recessed area of the first light outputting region is adjacent to the spacer, and at least one of the second light outputting region and the third outputting light region does not have an inwardly recessed area,
   wherein an area of the first light outputting region is greater than an area of the second light outputting region, and the area of the second light outputting region is greater than an area of the third light outputting region.

2. The display device of claim 1, wherein, when seen in the plan view, the rectangular shape of one of the second light outputting region and the third light outputting region has a vertical side which is longer than a horizontal side, and the rectangular shape of the other of the second light outputting region and the third outputting region has a horizontal side which is longer than a vertical side.

3. The display device of claim 2, wherein the first color is a red color, the second color is a green color, and the third color is a blue color.

4. The display device of claim 1, wherein the light blocking region has a minimum width of at least about 24 μm.

5. The display device of claim 2, wherein the pixel has a square shape.

6. The display device of claim 5, wherein, when seen in the plan view, a horizontal side of the pixel is parallel to a horizontal side of each of the first, second, and third light outputting regions, and a vertical side of the pixel is parallel to a vertical side of each of the first, second, and third light outputting regions.

7. The display device of claim 2, wherein the pixel further comprises a first emission region corresponding to the first subpixel and overlapping the first light outputting region, a second emission region corresponding to the second subpixel and overlapping the second light outputting region, and a third emission region corresponding to the third subpixel and overlapping the third light outputting region.

8. The display device of claim 7, wherein at least one side of the first emission region is disposed inwardly from a respective one of the first side, the second side, the third side and the fourth side of the first light outputting region, at least one side of the second emission region is disposed inwardly from at least one side of the second light outputting region, and at least one side of the third emission region overlaps at least one side of the third light outputting region.

9. The display device of claim 1, wherein the spacer has an octagonal shape and the inwardly recessed side of the first light outputting region includes a shape accommodating at least a portion of the octagonal shape.

10. A display device, comprising:
    a pixel including a first subpixel to display a first color, a second subpixel to display a second color, and a third subpixel to display a third color,
    a first display substrate including a first substrate, a subpixel electrode disposed on the first substrate and overlapping each of the first, second, and third subpixels, a pixel definition film disposed on the first substrate along boundaries between the first subpixel, the second subpixel, and the third subpixel and exposing the subpixel electrode, a first layer disposed on the subpixel electrode exposed by the pixel definition film, and a common electrode disposed on the first layer; and
    a second display substrate opposite to the first display substrate and including a second substrate, a second layer disposed on the second substrate and overlapping each of the first, second, and third subpixels, and a light blocking member disposed on the second substrate along the boundaries between the first subpixel, the second subpixel, and the third subpixel, wherein the light blocking member defines a light outputting region and a light blocking region of the second display substrate, the light outputting region includes a first light outputting region overlapping the first subpixel, a second light outputting region overlapping the second subpixel, and a third light outputting region overlapping the third subpixel, the first light outputting region, the second light outputting region, and the third light outputting region are defined by the light blocking region, and the first light outputting region has a first side, a second side, a third side and a fourth side each defined by the light blocking region;

as seen in a plan view, the first side having a first portion being a straight line extending in a first direction, a second portion being a straight line extending in the first direction, and an inwardly recessed area between the first portion and the second portion, as seen in the plan view, the second side opposing the first side and being a straight line extending continuously in the first direction from one end of the third side to one end of the fourth side, as seen in the plan view, the third side being a straight line extending continuously in a second direction from a first end of the first side to a first end of the second side, the second direction perpendicular to the first direction, and as seen in the plan view, the fourth side opposing the third side and being a straight line extending continuously in the second direction from a second end of the first side to a second end of the second side, wherein the inwardly recessed area of the first side is closer to the second side of the first light outputting region than the first portion and second portion of the first side, and the second light outputting region and the third light outputting region each have a rectangular shape, wherein, when seen in the plan view, the rectangular shape of one of the second light outputting region and the third light outputting region has a vertical side which is longer than a horizontal side, and, the rectangular shape of the other thereof has a horizontal side which is longer than a vertical side, and wherein a spacer is disposed in the light blocking region and protrudes in a direction where the display device displays, the spacer is positioned adjacent to the first light outputting region, the inwardly recessed area of the first light outputting region is adjacent to the spacer, and at least one of the second light outputting region and the third outputting light region does not have an inwardly recessed area, wherein an area of the first light outputting region is greater than an area of the second light outputting region that defines an entirety of the second outputting region, and the area of the second light outputting region is greater than an area of the third light outputting region.

11. The display device of claim 10 wherein the first color is a red color, the second color is a green color, and the third color is a blue color.

12. The display device of claim 11, wherein the first layer comprises a light-emitting layer and the second layer comprises a color control layer, the color control layer comprising a first wavelength conversion pattern overlapping the first subpixel to convert light with the third color into light with the first color, a second wavelength conversion pattern overlapping the second subpixel to convert the light with the third color into light with the second color, and a light transmission layer overlapping the third subpixel to transmit light with the third color.

13. The display device of claim 10, wherein the light blocking region has a minimum width of at least about 24 μm.

14. The display device of claim 12, further comprising a red color filter layer disposed between the second substrate and the first wavelength conversion pattern, a green color filter layer disposed between the second substrate and the second wavelength conversion pattern, and a blue color filter layer disposed between the second substrate and the light transmission layer.

15. The display device of claim 10, wherein the pixel definition film defines an emission region and a non-emission region of the first display substrate, and the emission region includes a first emission region overlapping the first subpixel and the first light outputting region, a second emission region overlapping the second subpixel and the second light outputting region, and a third emission region overlapping the third subpixel and the third light outputting region.

16. The display device of claim 15, wherein at least one side of the first emission region is disposed inwardly a respective one of the first side, the second side, the third side and the fourth side of the first light outputting region, at least one side of the second emission region is disposed inwardly from at least one side of the second light outputting region, and at least one side of the third emission region overlaps at least one side of the third light outputting region.

17. The display device of claim 10, further comprising a filling layer disposed between the first display substrate and the second display substrate and coupling the first display substrate and the second display substrate.

* * * * *